US008504885B2

(12) United States Patent
Haratsch et al.

(10) Patent No.: US 8,504,885 B2
(45) Date of Patent: Aug. 6, 2013

(54) METHODS AND APPARATUS FOR APPROXIMATING A PROBABILITY DENSITY FUNCTION OR DISTRIBUTION FOR A RECEIVED VALUE IN COMMUNICATION OR STORAGE SYSTEMS

(75) Inventors: Erich F. Haratsch, Bethlehem, PA (US); Nenad Miladinovic, Campbell, CA (US); Andrei Vityaev, San Jose, CA (US)

(73) Assignee: LSI Corporation, San Jose, CA (US)

( * ) Notice: Subject to any disclaimer, the term of this patent is extended or adjusted under 35 U.S.C. 154(b) by 477 days.

(21) Appl. No.: 12/751,973

(22) Filed: Mar. 31, 2010

(65) Prior Publication Data

US 2011/0246842 A1 Oct. 6, 2011

(51) Int. Cl.
*G06F 11/00* (2006.01)

(52) U.S. Cl.
USPC .......................................... 714/722; 714/763

(58) Field of Classification Search
USPC .................................. 714/721, 722, 723, 763
See application file for complete search history.

(56) References Cited

U.S. PATENT DOCUMENTS

| | | | |
|---|---|---|---|
| 5,867,429 A | 2/1999 | Chen et al. | |
| 6,134,141 A | 10/2000 | Wong | |
| 6,353,679 B1 * | 3/2002 | Cham et al. | 382/228 |
| 6,522,580 B2 | 2/2003 | Chen et al. | |
| 6,892,163 B1 * | 5/2005 | Herzog et al. | 702/181 |
| 7,388,781 B2 | 6/2008 | Litsyn et al. | |
| 7,647,548 B2 | 1/2010 | Haratsch et al. | |
| 2004/0057284 A1 | 3/2004 | Widmer et al. | |
| 2006/0015802 A1 | 1/2006 | Hocevar | |
| 2006/0221714 A1 | 10/2006 | Li et al. | |
| 2007/0089034 A1 | 4/2007 | Litsyn et al. | |
| 2007/0171714 A1 | 7/2007 | Wu et al. | |
| 2007/0189073 A1 | 8/2007 | Aritome | |
| 2007/0208905 A1 | 9/2007 | Litsyn et al. | |

(Continued)

FOREIGN PATENT DOCUMENTS

| | | |
|---|---|---|
| WO | WO 2007/132453 A2 | 11/2007 |
| WO | WO 2007/149678 A2 | 12/2007 |

(Continued)

OTHER PUBLICATIONS

Lee et al., "Effects of Floatng-Gate Interference on NAND Flash Memory Cell Operation," IEEE Electron Device Letters, pp. 264-266 (May 2002).

(Continued)

*Primary Examiner* — Marc Duncan
(74) *Attorney, Agent, or Firm* — Ryan, Mason & Lewis, LLP

(57) ABSTRACT

Methods and apparatus are provided for approximating a probability density function or distribution for a received value in communication or storage systems. A target distribution is approximated for a received value in one or more of a communication system and a memory device, by substantially minimizing a squared error between the target distribution of the received values and a second distribution obtained by mapping a predefined distribution, such as a Gaussian distribution, through a mapping function, wherein the second distribution has an associated set of parameters. The mapping function can be, for example, a piecewise linear function. The second distribution has a plurality of segments and each of the segments has an associated set of parameters. The associated set of parameters can be used to compute probability values, soft data values or log likelihood ratios.

34 Claims, 19 Drawing Sheets

U.S. PATENT DOCUMENTS

| | | | |
|---|---|---|---|
| 2007/0300130 A1 | 12/2007 | Gorobets | |
| 2008/0019188 A1 | 1/2008 | Li | |
| 2008/0123420 A1 | 5/2008 | Brandman et al. | |
| 2008/0151617 A1 | 6/2008 | Alrod et al. | |
| 2008/0291724 A1 | 11/2008 | Litsyn et al. | |
| 2009/0043951 A1 | 2/2009 | Shalvi et al. | |
| 2009/0220016 A1* | 9/2009 | Dangl et al. | 375/260 |
| 2009/0319868 A1* | 12/2009 | Sharon et al. | 714/763 |
| 2011/0051521 A1* | 3/2011 | Levy et al. | 365/185.19 |
| 2011/0246136 A1 | 10/2011 | Haratsch et al. | |
| 2011/0246859 A1 | 10/2011 | Haratsch et al. | |

FOREIGN PATENT DOCUMENTS

| | | |
|---|---|---|
| WO | WO 2008/042593 A1 | 4/2008 |
| WO | WO 2008/042598 A2 | 4/2008 |
| WO | WO 2009/114618 | 9/2009 |
| WO | WO 2010/002941 | 1/2010 |
| WO | WO 2010/002942 | 1/2010 |
| WO | WO 2010/002943 | 1/2010 |
| WO | WO 2010/002948 | 1/2010 |
| WO | WO 2010/039859 | 4/2010 |
| WO | WO 2010/039866 | 4/2010 |

OTHER PUBLICATIONS

Lee et al., "Effects of Floating-Gate Interference on NAND Flash Memory Cell Operation," IEEE Electron Device Letters, pp. 264-266 (May 2002).

Park, et al., "A Zeroing Cell-to-Cell Interference Page Architecture With Temporary LSB Storing and Parallel MSB Program Scheme for MLC NAND Flash Memories," IEEE J. of Solid State Circuits, vol. 43, No. 4, 919-928, (Apr. 2008).

Hagenauer et al., "A Viterbi Algorithm with Soft-decision Outputs and its Applications," IEEE Global Telecommunications Conference (GLOBECOM), vol. 3, 1680-1686 (Nov. 1989).

Bahl et al., "Optimal Decoding of Linear Codes for Minimizing Symbol Error Rate," IEEE Trans. on Information Theory, vol. IT-20(2), 284-87 (Mar. 1974).

Hagenauer et al., "Iterative decoding of binary block and convolutional codes," IEEE Transactions on Information Theory, 429-445 (Mar. 1996).

* cited by examiner

*FIG. 18*

PROBABILITY PARAMETER LOOK-UP TABLE 1800
(WITH ONE EXEMPLARY PERFORMANCE FACTOR)
(SHOWN FOR STATE 0)

| 1810 | | STATE 0 | | |
|---|---|---|---|---|
| 1820 | P/E CYCLES → | 0 | 5000 | 10000 |
| 1830 | SEGMENT 1 ($-\infty$ TO $a_1$) | $k_1, b_1$ | $k_1, b_1$ | $k_1, b_1$ |
| ⋮ | | | | |
| 1840 | SEGMENT N+1 ($a_n$ TO $\infty$) | $k_{N+1}, b_{N+1}$ | $k_{N+1}, b_{N+1}$ | $k_{N+1}, b_{N+1}$ |

METHODS AND APPARATUS FOR APPROXIMATING A PROBABILITY DENSITY FUNCTION OR DISTRIBUTION FOR A RECEIVED VALUE IN COMMUNICATION OR STORAGE SYSTEMS

CROSS-REFERENCE TO RELATED APPLICATIONS

The present application is related to United States patent application entitled "Methods and Apparatus for Computing a Probability Value of a Received Value in Communication or Storage Systems," and United States patent application entitled "Methods and Apparatus for Computing Soft Data or Log Likelihood Ratios for Received Values in Communication or Storage Systems," each filed contemporaneously herewith, and International Patent Application Serial No. PCT/US09/49326, entitled "Methods and Apparatus for Read-Side Intercell Interference Mitigation in Flash Memories," filed Jun. 30, 2009; International Patent Application Serial No. PCT/US09/49333, entitled "Methods and Apparatus for Soft Demapping and Intercell Interference Mitigation in Flash Memories," filed Jun. 30, 2009; and International Patent Application Serial No. PCT/US09/59077, entitled "Methods and Apparatus for Soft Data Generation for Memory Devices," filed Sep. 30, 2009, each incorporated by reference herein.

FIELD OF THE INVENTION

The present invention relates generally to techniques for detection and decoding in storage and communication systems, and more particularly, to methods and apparatus for approximating a probability density function or distribution (bra received value in communication or storage systems.

BACKGROUND OF THE INVENTION

A number of storage and communication systems use analog values to represent information. For example, storage devices use analog memory cells to store an analog value, such as an electrical charge or voltage, to represent the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

In multi-level NAND flash memory devices, for example, floating gate devices are employed with programmable threshold voltages in a range that is divided into multiple intervals with each interval corresponding to a different multibit value. To program a given multibit value into a memory cell, the threshold voltage of the floating gate device in the memory cell is programmed into the threshold voltage interval that corresponds to the value.

The analog values stored in memory cells are often distorted. The distortions are typically due to, for example, back pattern dependency (BPD), noise and intercell interference (ICI). For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008), each incorporated by reference herein.

A probability density function (PDF) of a continuous random variable describes the relative probability that a given value of the random variable will occur at a given point in time. The voltage distributions for memory cells, for example, are often expressed using such probability density functions. Generally, the threshold voltage of a cell is the voltage that needs to be applied to the cell so that the cell conducts a certain amount of current. The threshold voltage is a measure for the data stored in a cell.

Statistical noise in a communication system, for example, is typically approximated using a probability density function having a normal distribution (often referred to as a Gaussian distribution). Computing probability values for a Gaussian distribution is relatively straightforward. The above-described distortions in memory devices, however, as well as imperfections in the write process, may cause the probability density function for received values read from the memory to have an arbitrary or non-Gaussian distribution. The computation of probability values for such arbitrary distributions is significantly more complex than for a Gaussian distribution.

A need therefore exists for improved methods and apparatus for computing probability values for received or stored values that have an arbitrary probability density function. Yet another need exists for improved methods and apparatus for computing probability values for an arbitrary PDF that are based on techniques for computing probability values for a predefined PDF, such as a Gaussian PDF. Among other benefits, such improved techniques for computing probability values for received or stored values will lower the computational complexity of devices incorporating such techniques. A further need exists for methods and apparatus for approximating a probability density function or distribution for a received value in communication or storage systems.

SUMMARY OF THE INVENTION

Generally, methods and apparatus are provided for approximating a probability density function or distribution for a received value in communication or storage systems. According to one aspect of the invention, a target distribution is approximated for a received value in a communication system or a memory device, by substantially minimizing a squared error between the target distribution of the received values and a second distribution obtained by mapping a predefined distribution, such as a Gaussian distribution, through a mapping function, wherein the second distribution has an associated set of parameters. The mapping function can be, for example, a piecewise linear function. The target and second distributions can be, for example, probability density functions.

The second distribution has a plurality of segments and each of the segments has an associated set of parameters. The associated set of parameters are used to compute probability values, soft data values or log likelihood ratios for the received values in the communication system or memory device. The associated set of parameters can be stored in at least one table or expressed using an expression.

The squared error can be (i) computed individually for each of the segments and wherein the parameters are selected for a given segment to substantially minimize a squared error for the given segment; or (ii) collectively computed for substantially all of the segments and wherein the parameters are selected for each segment by substantially minimizing the combined squared error.

The target distribution can optionally be obtained through measurements, such as measurements obtained as a function of at least one performance factor. In this manner, the squared error can be substantially minimized for the at least one performance factor to obtain the parameters for the performance factor.

The set of parameters are obtained during an initial parameter characterization phase or adaptively on an intermittent basis. In an adaptive implementation, the set of parameters are adaptively updated using measured or estimated distributions for the received value. The estimated distributions are based on a measurement of parameters for the distribution, a passage of time or a usage counter. The adaptively updated parameters can be used to update one or more tables or to evaluate an expression that accounts for one or more performance factors.

A more complete understanding of the present invention, as well as further features and advantages of the present invention, will be obtained by reference to the following detailed description and drawings.

BRIEF DESCRIPTION OF THE DRAWINGS

FIG. 18 is a sample table for an exemplary probability parameter look-up table that records the parameters for each segment of the piecewise linear mapping function.

DETAILED DESCRIPTION

The present invention provides methods and apparatus for computing probability values for an arbitrary PDF. As previously indicated, the computation of probability values for a Gaussian distribution is relatively straightforward. Generally, for a Gaussian PDF, the log likelihood calculation simplifies to a distance calculation as a Gaussian PDF is completely defined by its mean and variance. The present invention recognizes that when a random variable has an arbitrary distribution, however, the computation of the probability values is significantly more complex.

According to one aspect of the present invention, methods and apparatus are provided for computing probability values for an arbitrary PDF that are based on techniques for computing probability values for a predefined PDF, such as a Gaussian PDF. In one exemplary implementation, the present invention employs a mapping function, $\phi$, to map a Gaussian PDF, $f_x(x)$, to an arbitrary probability function of interest, $f_r(r)$. In further variations, non-Gaussian PDFs that can be described with predefined analytical functions can be mapped to arbitrary PDFs.

The present invention recognizes that it may be difficult in some applications to find the mapping function, $\phi$. Thus, according to another aspect of the invention, the mapping function, $\phi$, is approximated with a piecewise linear function, $\phi$, comprised of a plurality of linear segments. Thus, within each segment, a Gaussian approximation is used to compute the probabilities for the variable r with the random PDF. In a further variation, the mapping function, $\phi$, is defined over a plurality of segments, where each segment has a set of parameters. Thus, within each segment, the probabilities for the variable r with the random PDF are computed based on a predefined PDF, such as a Gaussian PDF, and the corresponding set of parameters.

The present invention can be used, for example, to compute probability values in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for memory devices, such as the use of voltages, resistances or currents to represent stored data, as would be apparent to a person of ordinary skill in the art. In addition, while the present invention is illustrated herein in the context of exemplary storage systems, the present invention can also be applied to a communication system, as would be apparent to a person of ordinary skill in the art.

Figure 1:
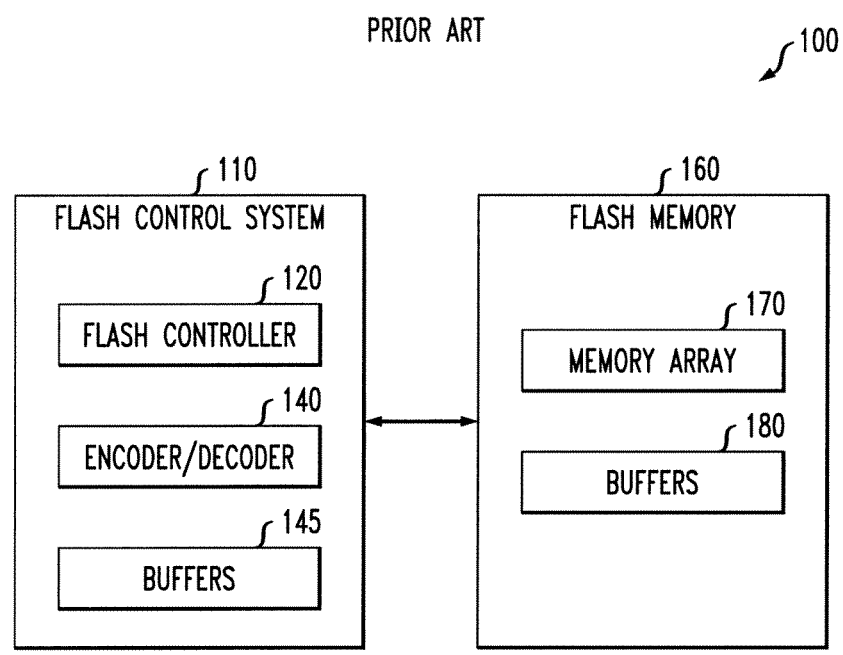
FIG. 1 is a schematic block diagram of a conventional flash memory system.

FIG. 1 is a schematic block diagram of a conventional flash memory system 100. As shown in FIG. 1, the exemplary flash memory system 100 comprises a flash control system 110 and a flash memory block 160. The exemplary flash control system 110 comprises a flash controller 120, an encoder/decoder block 140 and one or more buffers 145. In an alternative embodiment, the encoder/decoder block 140 and some buffers 145 may be implemented inside the flash controller 120. The encoder/decoder block 140 and buffers 145 may be implemented, for example, using well-known commercially available techniques and/or products.

The exemplary flash memory block 160 comprises a memory array 170 and one or more buffers 180 that may each be implemented using well-known commercially available techniques and/or products. The memory array 170 may be embodied as a single-level or multi-level cell flash memory, such as a NAND flash memory, a phase-change memory (PCM), an MRAM memory, a NOR flash memory or another non-volatile flash memory. While the invention is illustrated primarily in the context of a multi-level cell NAND flash memory, the present invention can be applied to single-level cell flash memories and other non-volatile memories as well, as would be apparent to a person of ordinary skill in the art.

Multi-Level Cell Flash Memory

Figure 2:
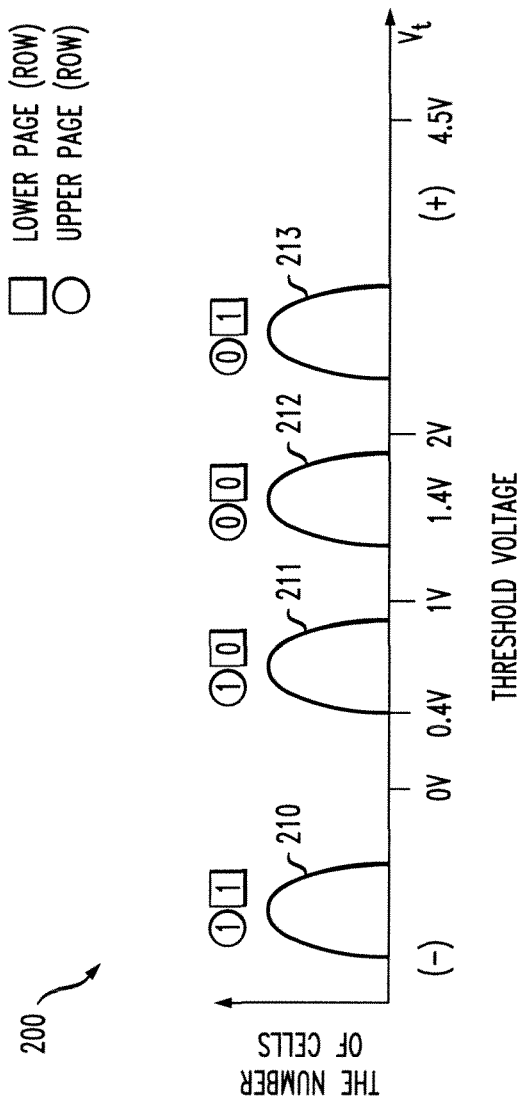
FIG. 2 illustrates an exemplary threshold voltage distribution for the exemplary flash memory of FIG. 1.

In a multi-level cell NAND flash memory, a threshold detector is typically employed to translate the voltage value associated with a particular cell to a predefined memory state. FIG. 2 illustrates an exemplary threshold voltage distribution for the exemplary multi-level cell flash memory 170 of FIG. 1, based on the teachings of U.S. Pat. No. 6,522,580, incorporated by reference herein. Generally, the threshold voltage of a cell is the voltage that needs to be applied to the cell so that the cell conducts a certain amount of current. The threshold voltage is a measure for the data stored in a cell.

In the exemplary embodiment shown in FIG. 2, each storage element employs four possible data states to store two bits of data in each memory cell. FIG. 2 illustrates four peaks 210-213, with each peak corresponding to one state. In a multi-level cell flash device, the different peaks 210-213 of the threshold voltage distribution graph 200 are used for storing two bits in the cell.

The peaks 210-213 of the threshold voltage distribution graph 200 are labeled with corresponding binary values. Thus, when a cell is in a first state 210, it represents a "1" for the lower bit (also known as least significant bit, LSB) and a "1" for the upper bit (also known as most significant bit, MSB). State 210 is generally the initial unprogrammed or erased state of the cell. Likewise, when a cell is in the second state 211, it represents a "0" for the lower bit and a "1" for the upper bit. When a cell is in the third state 212, it represents a "0" for the lower bit and a "0" for the upper bit. Finally, when a cell is in the fourth state 213, it represents a "1" for the lower bit and a "0" for the upper bit.

Threshold voltage distribution 210 represents a distribution of the threshold voltages $V_t$ of the cells within the array that are in an erased state ("11" data state), with negative threshold voltage levels below 0 volts. Threshold voltage distributions 211 and 212 of memory cells storing "10" and "00" user data, respectively, are shown to be between 0 and 1 volts and between 1 and 2 volts, respectively. Threshold voltage distribution 213 shows the distribution of cells that have been programmed to the "01" data state, with a threshold voltage level set between 2 and 4.5 volts of the read pass voltage.

Thus, in the exemplary embodiment of FIG. 2, 0 volts, 1 volt and 2 volts can be used as voltage level thresholds between each level or state. The voltage level thresholds are used by the flash memory 160 (e.g., sensing circuits in the flash memory 160) to determine the voltage level or state of a given cell. The flash memory 160 will assign one or more bits to each cell based on a comparison of the measured voltages to the voltage level thresholds, which are then transmitted as hard decisions to the flash control system 110. In addition or alternatively, in an implementation using soft information, the flash memory 160 may transmit the measured voltages or a quantized version of the measured voltages to the flash control system 110 as soft information, where a larger number of bits is used to represent the measured voltage than the number of bits stored in the memory cell.

It is further noted that cells are typically programmed using well-known Program/Verify techniques. Generally, during a Program/Verify cycle, the flash memory 160 gradually applies an increasing voltage to store a charge in the cell transistor until a minimum target threshold voltage is exceeded. For example, when programming a '10' data state in the example of FIG. 2, the flash memory 160 may gradually apply an increasing voltage to store a charge in the cell transistor until a minimum target threshold voltage of 0.4V is exceeded.

As discussed further below, each of the two bits stored in a single memory cell is from a different page. In other words, each bit of the two bits stored in each memory cell carries a different page address. The right side bit shown in FIG. 2 is accessed when a lower page address is input. The left side bit is accessed when an upper page address is input.

Figure 3:
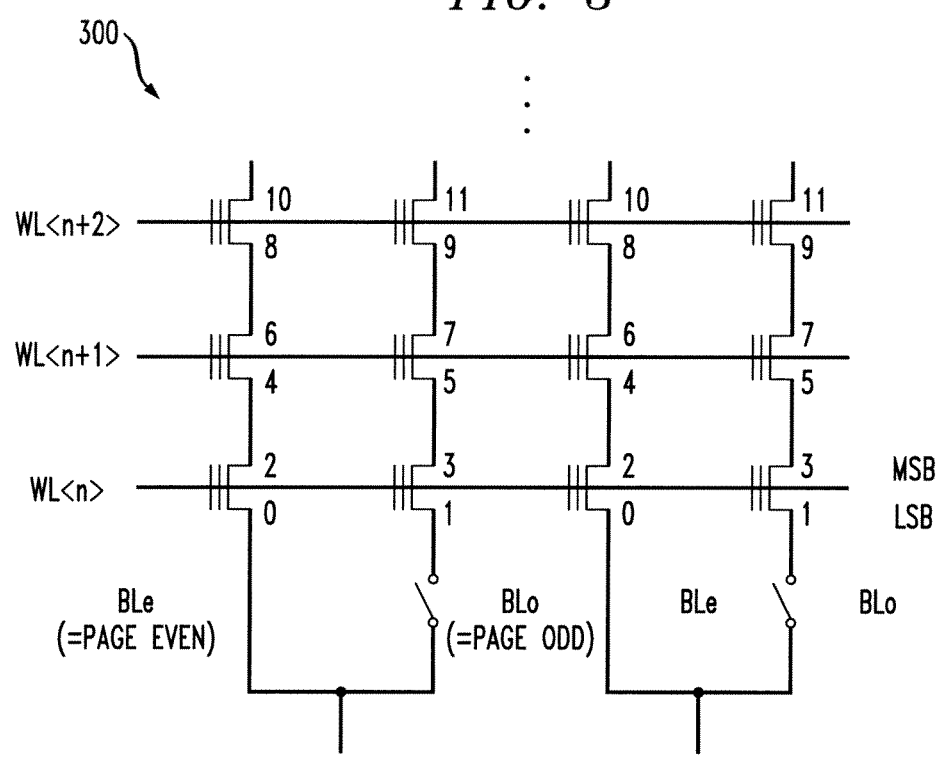
FIG. 3 illustrates the architecture of an exemplary flash cell array in a multi-level cell (MLC) flash memory device.

FIG. 3 illustrates the architecture of an exemplary flash cell array 300 in a multi-level cell (MLC) flash memory device 160, where each exemplary cell typically corresponds to a floating-gate transistor that stores two bits. In FIG. 3 each cell is associated with two numbers for the two pages to which the two bits belong. The exemplary cell array section 300 shows wordlines n through n+2 and four bitlines. The exemplary flash cell array 300 is partitioned into even and odd pages, where for example cells with even numbers (such as the cell with the numbers 0 and 2) correspond to even pages, and cells with odd numbers (such as the cell with the numbers 1 and 3) correspond to odd pages. Wordline n stores for example even pages 0 and 2 in the even bitlines, and odd pages 1 and 3 in the odd bit lines.

In addition, FIG. 3 indicates an exemplary program sequence where either an even or odd bitline cell is selected and programmed sequentially (bottom up) in the indicated order. The numbers indicate the order in which the pages are programmed. For example, page 0 is programmed before page 1. For a further discussion of the programming of even and odd pages, see for example K.-T. Park et al., "A Zeroing Cell-to-Cell Interference Page Architecture with Temporary LSB Storing and Parallel MSB Program Scheme for MLC NAND Flash Memories," IEEE Journal of Solid-State Circuits, Vol. 43. No. 4, 919-928 (April 2008), incorporated by reference herein.

As previously indicated, the analog values stored in memory cells and transmitted in communication systems are often distorted, for example, due to back pattern dependency, noise and intercell interference. Thus, the present invention recognizes that the threshold voltage distributions shown in FIG. 2 will not have Gaussian distributions in the presence of such distortions.

Figure 4:
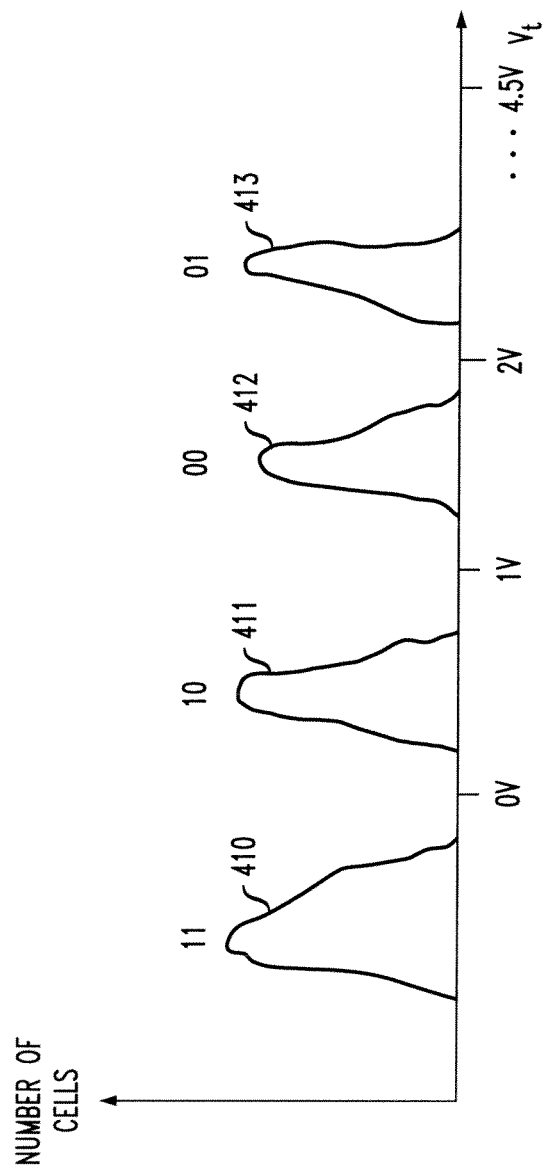
FIGS. 4 and 5 illustrate exemplary threshold voltage distributions over time for an exemplary multi-level cell flash memory in the presence of significant distortions.

FIG. 4 illustrates an exemplary threshold voltage distribution for an exemplary multi-level cell flash memory in the presence of significant distortions. As previously indicated, the threshold voltage of a cell is the voltage that needs to be applied to the cell so that the cell conducts a certain amount of current. The threshold voltage is a measure for the data stored in a cell.

In the exemplary embodiment shown in FIG. 4, each storage element employs four possible data states to store two bits of data in each memory cell. FIG. 4 illustrates four peaks 410-413, with each peak corresponding to one state. In a multi-level cell flash device, the different peaks 410-413 of the threshold voltage distribution graph 400 are used for storing two bits in the cell. The peaks 410-413 of the threshold voltage distribution graph 400 are labeled with corresponding binary values, in a similar manner to FIG. 2.

Threshold voltage distribution 410 represents a distribution of the threshold voltages $V_t$ of the cells within the array that are in an erased state ("11" data state), with negative threshold voltage levels below 0 volts. Threshold voltage distributions 411 and 412 of memory cells storing "10" and "00" user data, respectively, are shown to be between 0 and 1 volts and between 1 and 2 volts, respectively. Threshold voltage distribution 413 shows the distribution of cells that have been programmed to the "01" data state, with a threshold voltage level set between 2 and 4.5 volts of the read pass voltage. Thus, in the exemplary embodiment of FIG. 4, 0 volts, 1 volt and 2 volts can be used as voltage level thresholds between each level or state.

Figure 5:
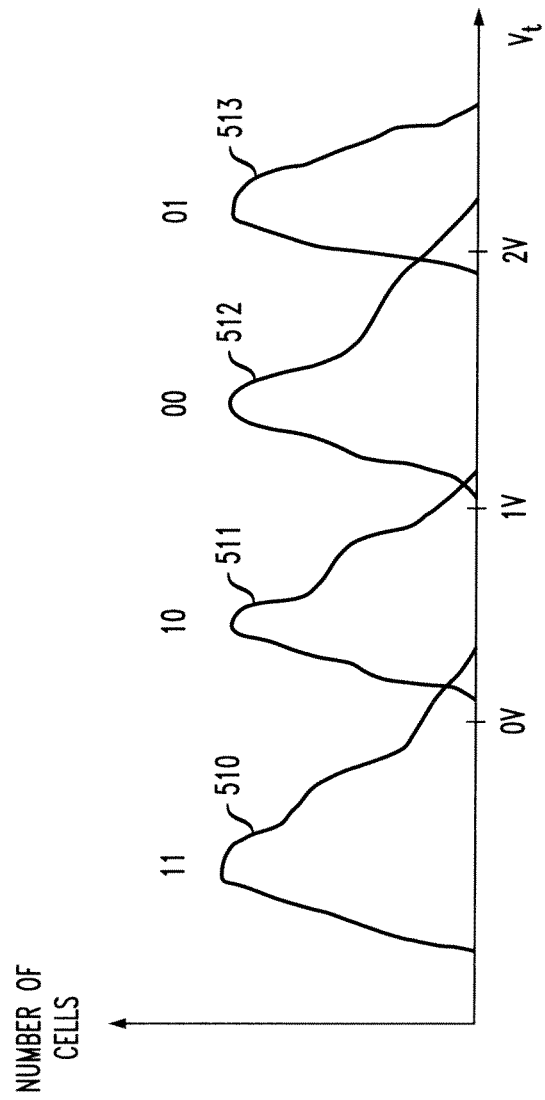

For the exemplary threshold voltage distributions shown in FIG. 4, peak 410 tends to have the widest distribution, relative to the other peaks 411-413. In addition, the present invention recognizes that the exemplary threshold voltage distributions will change over time, for example, due to cycling and aging. Thus, FIG. 5 illustrates the exemplary threshold voltage distributions of FIG. 4 after the passage of some time and cycling. Generally, the peaks 510-513 in FIG. 5, tend to have a wider distribution and be more arbitrary, relative to the corresponding peaks 410-413 of FIG. 4, and the peaks 510-513 may even overlap as a result.

Figure 6:
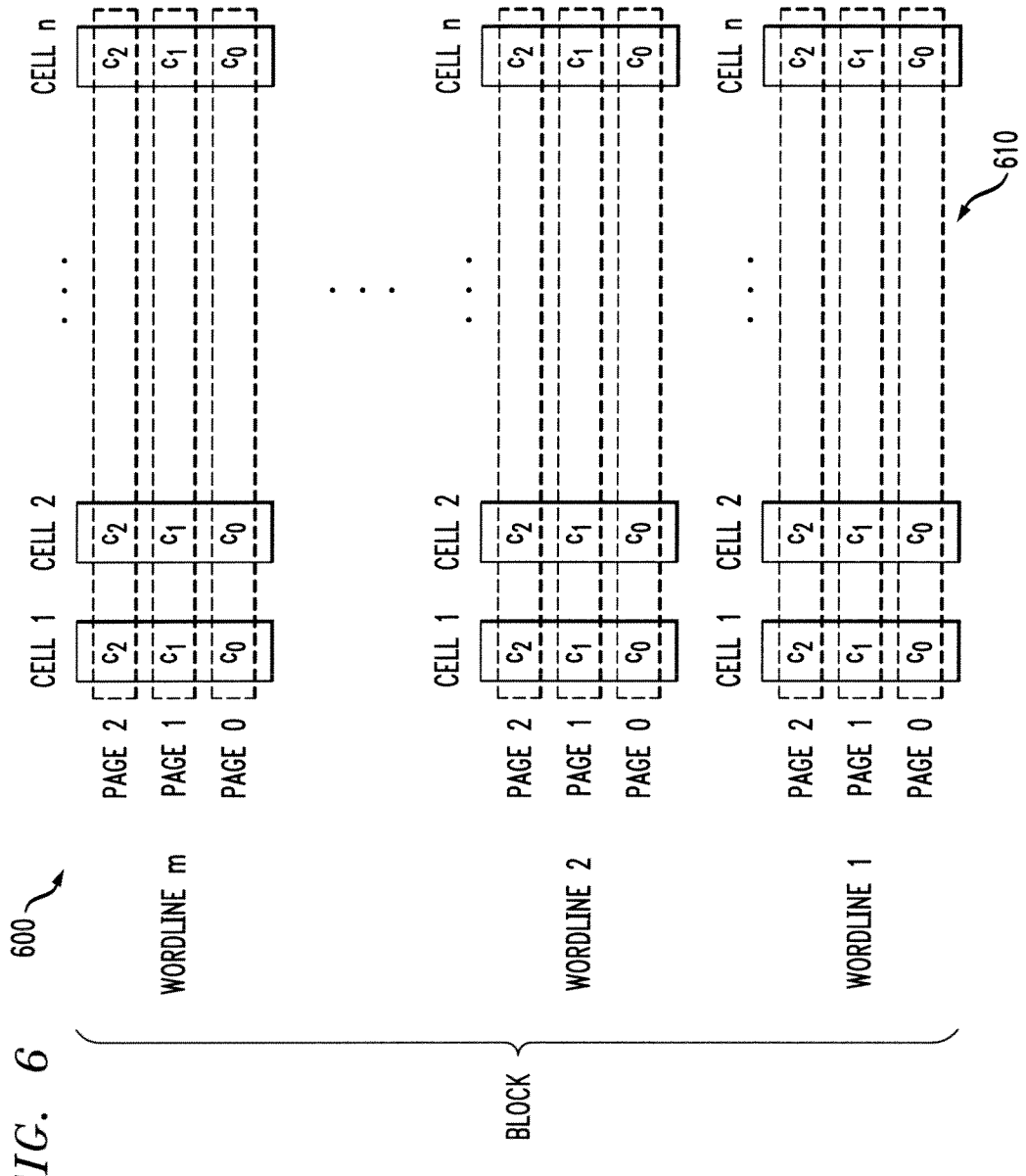
FIG. 6 illustrates an exemplary flash cell array in a multi-level cell (MLC) flash memory device in further detail.

FIG. 6 illustrates an exemplary flash cell array 600 in a multi-level cell (MLC) flash memory device 160 in further detail. As shown in FIG. 6, the flash cell array 600 stores three bits per flash cell, $c_i$. FIG. 6 illustrates the flash cell array architecture for one block where each exemplary cell typically corresponds to a floating-gate transistor that stores three bits. The exemplary cell array 600 consists of m wordlines and n bitlines. Typically, in current multi-page cell flash memories the bits within a single cell belong to different pages. In the example of FIG. 6, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 6) correspond to even pages, and cells with odd numbers (such as cells 1 and 3 in FIG. 6) correspond to odd pages. In this case, a page (such as page 0) would contain an even page (even page 0) in even cells and an odd page (odd page 0) in odd cells.

Intercell Interference and Other Disturbances

Figure 7:
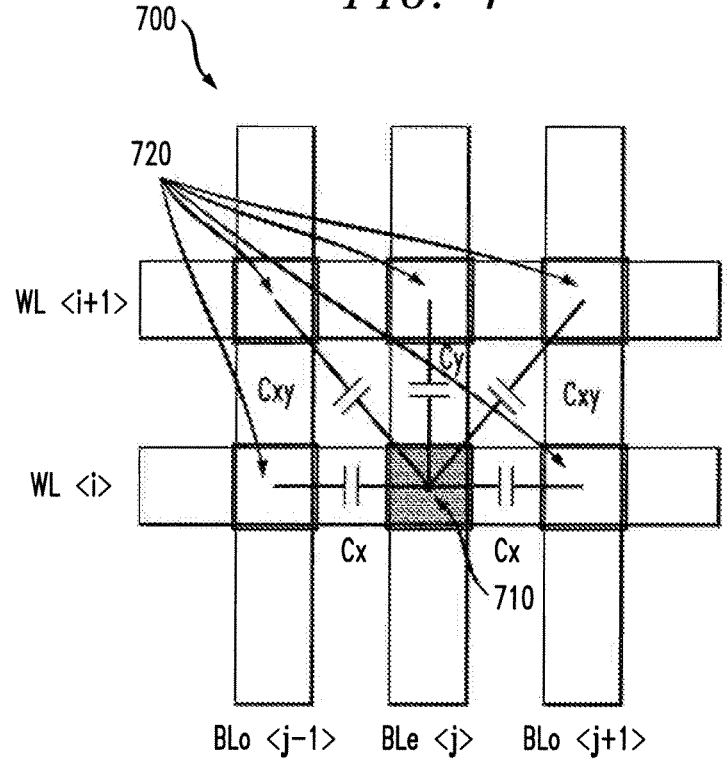
FIG. 7 illustrates the disturbances that are present for a target cell due to a number of exemplary aggressor cells, such as intercell interference, back pattern dependency, noise and other distortions.

FIG. 7 illustrates the disturbances that are present for a target cell 710 due to a number of exemplary aggressor cells 720, such as intercell interference, back pattern dependency, noise and other distortions. The following notations are employed in FIG. 7:
 WL: wordline;
 BL: bitline;
 BLo: odd bitline:
 BLe: even bitline: and
 C: capacitance.

ICI, for example, is caused by aggressor cells 720 that are programmed after the target cell 710 has been programmed. The ICI changes the voltage, $V_t$, of the target cell 710. In the exemplary embodiment, a "bottom up" programming scheme is assumed and adjacent aggressor cells in wordlines i and i+1 cause ICI for the target cell 710. With such bottom-up programming of a block, ICI from the lower wordline i−1 is removed, and up to five neighboring cells contribute to ICI as aggressor cells 720, as shown in FIG. 7. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells need to be considered. Other cells that are further away from the target cell can be neglected, if their contribution to ICI is negligible. In general, the aggressor cells 720 are identified by analyzing the programming sequence scheme (such as bottom up or even/odd techniques) to identify the aggressor cells 720 that are programmed after a given target cell 710.

Generally, $V_t$ is the voltage representing the data stored on a cell and obtained during a read operation. $V_t$ can be obtained by a read operation, for example, as a soft voltage value with more precision than the number of bits stored per cell, or as a value quantized to a hard voltage level with the same resolution as the number of bits stored per cell (e.g., 3 bits for 3 bits/cell flash).

For a more detailed discussion of ICI mitigation techniques, see, for example, International Patent Application Serial No. PCT/US09/49326, entitled "Methods and Apparatus for Read-Side Intercell Interference Mitigation in Flash Memories;" or International Patent Application Serial No. PCT/US09/49327, entitled "Methods and Apparatus for Write-Side Intercell Interference Mitigation in Flash Memories," each incorporated by reference herein.

Probability Computation

While the present invention is illustrated in the context of probability computations for a soft demapper in a flash control system, the present invention can be employed in any system where probabilities are computed for a received value in a storage or communications system, as would be apparent to a person of ordinary skill in the art. For example, the present invention can be employed in MAP detectors and iterative decoders and/or demappers that use probabilities, such as those based on LDPC coding, turbo coding, the Soft-Output Viterbi Algorithm (SOVA) or BCJR algorithm. For a more detailed discussion of exemplary LDPC decoders, see, for example, U.S. Pat. No. 7,647,548, incorporated by reference herein. For a more detailed discussion of exemplary SOVA detectors, see, for example, J. Hagenauer and P. Hoeher, "A Viterbi Algorithm with Soft-decision Outputs and its Applications," IEEE Global Telecommunications Conference (GLOBECOM), vol. 3, 1680-1686 (November 1989). For a more detailed discussion of exemplary BCJR detectors, see, for example, L. Bahl, J. Cocke, F. Jelinek, and J. Raviv, "Optimal Decoding of Linear Codes for Minimizing Symbol Error Rate," IEEE Trans. on Information Theory, Vol. IT-20 (2), 284-87 (March 1974). For a more detailed discussion of Turbo coding, see, for example, J. Hagenauer, E. Offer and L. Papke, "Iterative decoding of binary block and convolutional codes," IEEE Transactions on Information Theory, 429-445 (March 1996).

The present invention provides probability computation techniques for communication and storage systems, such as flash memories. In one example, probability values are computed based on data read by the flash memory, where the read data values have a distribution that is arbitrary or non-Gaussian. The generated probability information can optionally be used for soft decision decoding. As used herein, the term "probability density functions" shall include probability density functions, distributions and approximations thereof, such as histograms and Gaussian approximations.

Figure 8:
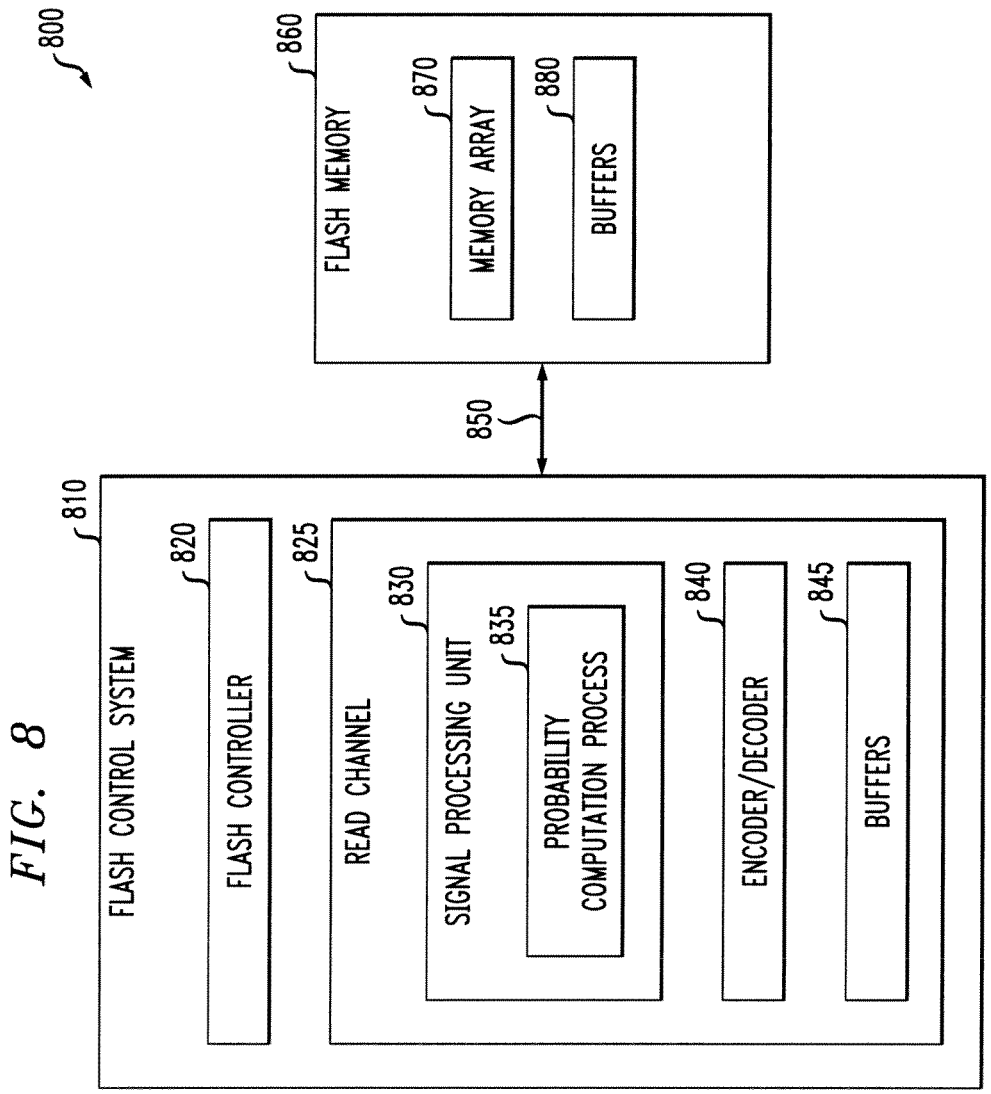
FIG. 8 is a schematic block diagram of an exemplary flash memory system incorporating controller-based probability computation and soft demapping/soft data generation techniques in accordance with the present invention.

FIG. 8 is a schematic block diagram of an exemplary flash memory system 800 incorporating controller-based probability computation techniques in accordance with the present invention. As shown in FIG. 8, the exemplary flash memory system 800 comprises a flash control system 810 and a flash memory block 860, connected by an interface 850. The exemplary flash control system 810 comprises a flash controller 820 and a read channel 825, typically on one or more integrated circuits.

The exemplary read channel 825 comprises a signal processing unit 830, an encoder/decoder block 840 and one or more buffers 845. It is noted that the term "read channel" can encompass the write channel as well. In an alternative embodiment, the encoder/decoder block 840 and some buffers 845 may be implemented inside the flash controller 820. The encoder/decoder block 840 and buffers 845 may be implemented, for example, using well-known commercially available techniques and/or products, as modified herein to provide the features and functions of the present invention.

The exemplary signal processing unit 830 comprises one or more processors that implement one or more probability computation processes 835, discussed further below in conjunction with, for example, FIG. 12. The exemplary flash memory block 860 comprises a memory array 870 and one or more buffers 880 that may each be implemented using well-known commercially available techniques and/or products.

It is noted that the probability computation process 835 may optionally be implemented in the flash memory block 860, as would be apparent to a person of ordinary skill in the art. For a more detailed discussion of this alternate implementation of the signal processing unit in the flash memory, see, International Patent Application Serial No. PCT/US09/59077, entitled "Methods and Apparatus for Soft Data Generation for Memory Devices," filed Sep. 30, 2009 and incorporated by reference herein.

The exemplary signal processing unit 830 may also include one or more soft demapper and/or soft data generation processes that utilize the computed probability values. The interface 850 may optionally be implemented, for example, in accordance with the teachings of International PCT Patent Application Serial No. PCT/US09/49328, entitled "Methods and Apparatus for Interfacing Between a Flash Memory Controller and a Flash Memory Array", filed Jun. 30, 2009 and incorporated by reference herein, which increases the information-carrying capacity of the interface 850 using, for example, Double Data Rate (DDR) techniques. During a write operation, the interface 850 transfers the program values to be stored in the target cells, typically using page or wordline level access techniques. For a more detailed discussion of exemplary page or wordline level access techniques for writing and reading, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

During a read operation, the interface 850 transfers hard and/or soft read values that have been obtained from the memory array 870 for target and aggressor cells. For example, in addition to read values for the page with the target cell, read values for one or more adjacent pages in upper/lower wordlines or neighboring even or odd bit lines are transferred over the interface bus. In the embodiment of FIG. 8, the disclosed soft data generation techniques are implemented outside the flash memory, typically in a process technology optimized for logic circuits to achieve the lowest area. It is at the expense, however, of the additional aggressor cell data and the soft read values with increased precision compared to the hard read values that may be transferred on the interface 850.

Soft Data Generation Using Probability Computations

The flash memory 860 optionally provides hard or soft read values to the flash control system 810. Enhanced soft data such as log-likelihood ratios is generated from the read values provided by the flash memory 860 to thereby improve the decoding performance in the flash control system 810. In an implementation using soft read values, the flash memory system 860 transmits the measured voltages or a quantized version of the measured voltages to the flash control system 810 as soft information, where a larger number of bits is used to represent the measured voltage than the number of bits stored in the memory cell.

Figure 9A:
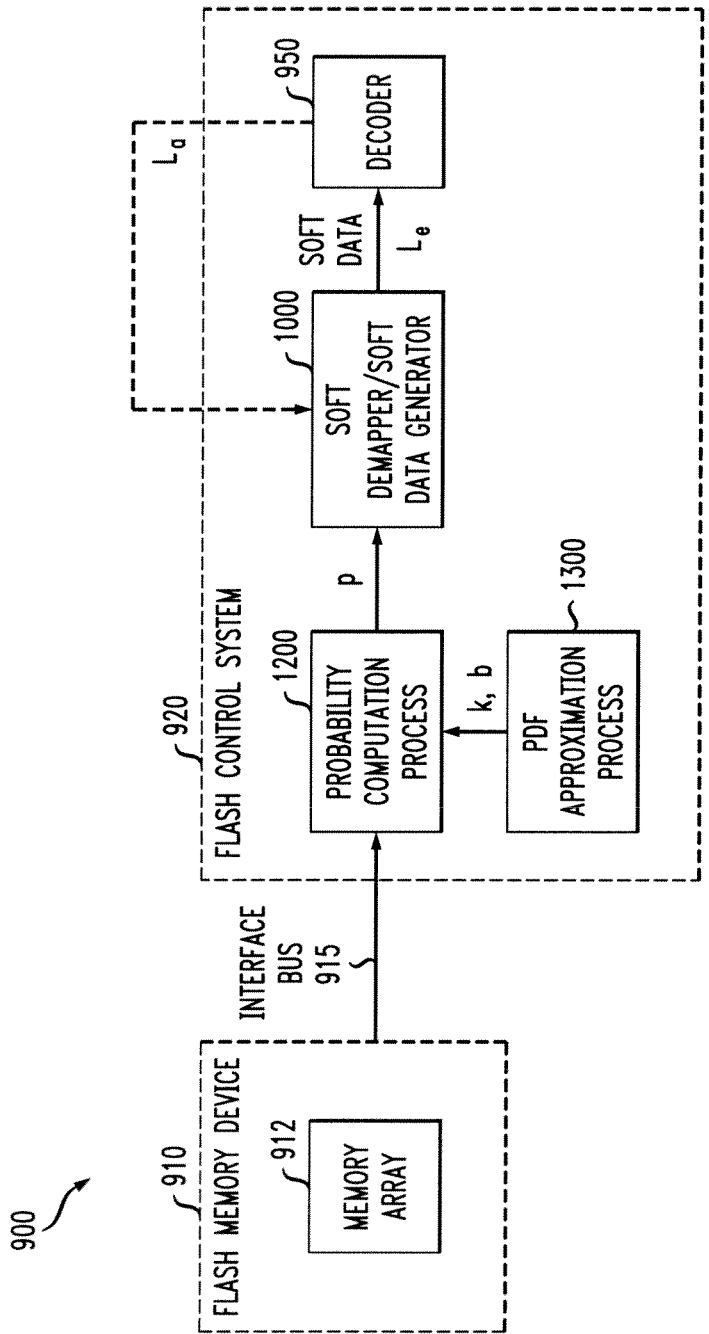
FIG. 9A illustrates an exemplary flash memory system with controller-based soft data generation using probability computations in accordance with one embodiment of the present invention.

FIG. 9A illustrates an exemplary flash memory system 900 with controller-based soft data generation using probability computations in accordance with one embodiment of the present invention. As shown in FIG. 9A, the exemplary flash memory system 900 comprises a flash memory block 910 and a flash control system 920, connected by an interface 915. As discussed hereinafter, soft or hard read values (or both) can be assigned by the flash memory block 910 and are transferred over the interface 915 to the flash control system 920 for further decoding and processing. The exemplary flash memory system 900 may also include one or more buffers, similar to the buffers 845, 880 of FIG. 8.

The exemplary flash control system 920 comprises a probability computation block 1200 (FIG. 12) that computes probability values, p, such as probability densities or probabilities, a PDF approximation process 1300 (FIG. 13) that provides parameters (k and b in the exemplary embodiment), a soft demapper/soft data generator 1000 (FIG. 10A) that computes log-likelihood ratios $L_e$ and a decoder 950 that provides LLRs $L_a$. The decoder 950 may be embodied, for example, using an LDPC decoding algorithm, such as a Belief Propagation, Message Passing, Sum-Product or Min-Sum algorithm. For a more detailed discussion of exemplary decoders 950, see, for example, International Patent Application Serial No. PCT/US09/59077, entitled "Methods and Apparatus for Soft Data Generation for Memory Devices." filed Sep. 30, 2009 and incorporated by reference herein.

As shown in FIG. 9A, the soft information generated by the soft demapper/soft data generator 1000 can optionally be used for iterative demapping and decoding between the soft demapper/soft data generator 1000 and the decoder 950. Generally, as shown in FIG. 9A, the soft demapper/soft data generator 1000 generates soft information in the form of LLRs, $L_e$, as discussed below in the section entitled "Computation of Soft Data (LLRs)." Initially, the LLRs. $L_e$, computed by the soft demapper/soft data generator 1000 are based on the probability densities or probabilities computed by the probability computation block 1200, which are in turn based on the soft or hard readouts (or both) from the flash memory 910 and the corresponding statistics. The LLRs, $L_e$, are processed by the decoder 950 to generate new soft information, $L_a$, that is fed back to the soft demapper/soft data generator 1000 in an iterative manner, until the iterative process converges to a final decision.

It is noted that the parameters $k_i, b_i$ of the piece wise linear function $\phi$ that are determined by the PDF approximation process 1300 for each segment, can optionally be stored in a look-up table, as discussed further below in conjunction with FIG. 14.

Figure 9B:
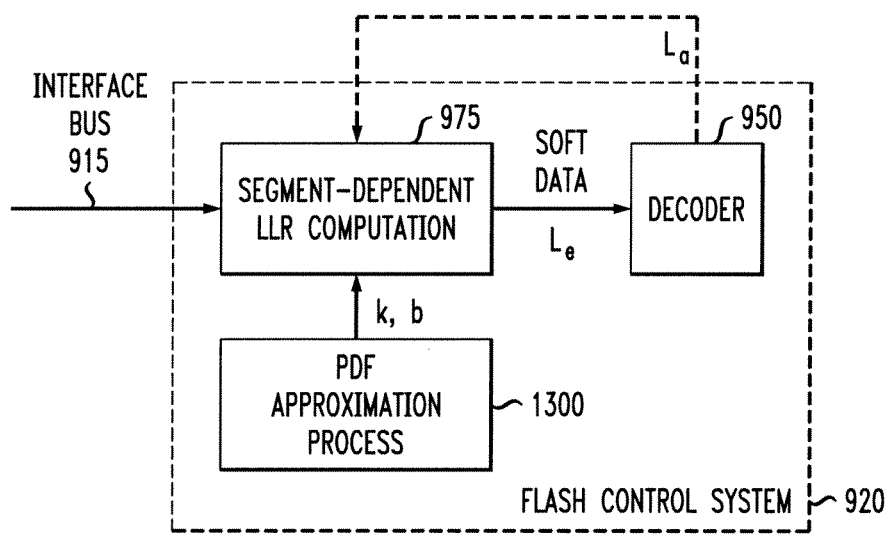
FIG. 9B illustrates a segment-dependent LLR computation block in accordance with an alternate implementation of the exemplary flash memory system of FIG. 9A.

FIG. 9B illustrates a segment-dependent LLR computation block 975 in accordance with an alternate implementation of the exemplary flash memory system 900 of FIG. 9A. The segment-dependent LLR computation block 975 of FIG. 9B replaces the soft demapper/soft data generator 1000 and probability computation block 1200 in FIG. 9A. An exemplary implementation for the segment-dependent LLR computation block 975 is discussed further below in conjunction with FIG. 10B. While the PDF approximation process 1300 is part of the flash control system 920 in the exemplary embodiments shown in FIGS. 9A and 9B, the PDF approximation process 1300 can alternatively be outside the flash control system, where it can be implemented in software, firmware or as part of the memory manufacturing process. The computation of parameters k and b by the PDF approximation process 1300 is discussed further below in conjunction with FIG. 13.

Soft Demapper/Soft Data Generator 1000

Figure 10A:
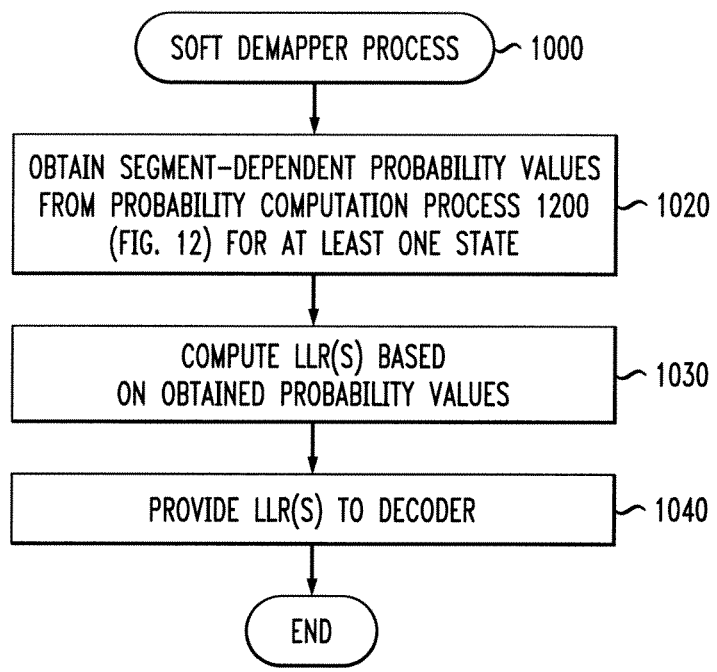
FIG. 10A is a flow chart describing an exemplary soft demapping process to generate soft information or log-likelihood ratios (LLRs) using segment-dependent probability computations.

FIG. 10A is a flow chart describing an exemplary soft demapping process 1000 incorporating features of the present invention to generate LLRs using probability computations. Generally, the exemplary soft demapping process 1000 generates LLRs based on the segment-dependent probability values computed by the probability computation process 1200 of FIG. 12. The probability values may comprise probability densities or probabilities. As shown in FIG. 10A, the exemplary soft demapping process 1000 initially obtains the segment-dependent probability values from the probability computation process 1200 for at least one state (and typically for all states). As discussed above in conjunction with FIG. 2, in the exemplary embodiment, each storage element employs four possible data states to store two bits of data in each memory cell (each of the four peaks 210-213 in FIG. 2 corresponds to one state).

The obtained probability values are then used during step 1030 to compute the LLR(s). The LLR(s) are discussed below in the section entitled "Computation of Soft Data (LLRs)." The computed LLRs are then provided to the decoder 950 during step 1040, or optionally to an interleaver or deinterleaver. For a discussion of suitable interleavers and deinterleavers, see, for example, International Patent Application Serial No. PCT/US09/59077, entitled "Methods and Apparatus for Soft Data Generation for Memory Devices," filed Sep. 30, 2009, and incorporated by reference herein. The computed LLRs may optionally be used to make a final decision on the read data, for example, based on the sign of the LLRs.

Segment-Dependent LLR Computation Block 975/1050

Figure 10B:
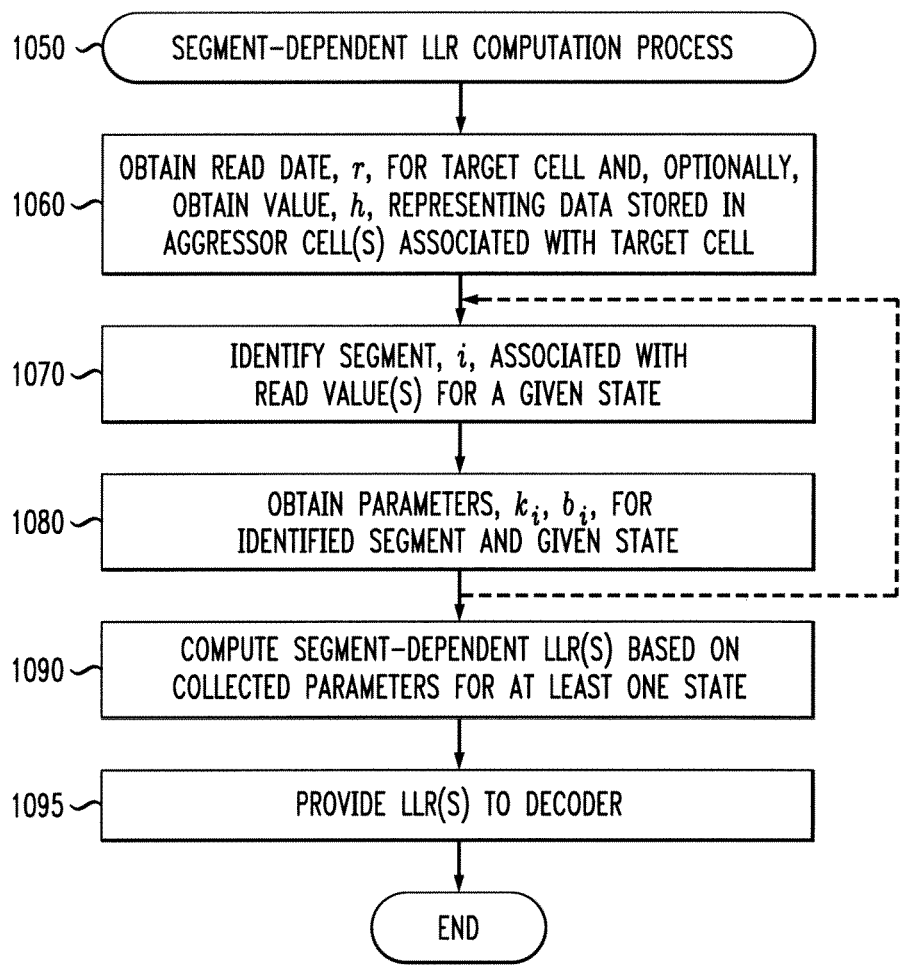
FIG. 10B is a flow chart describing an exemplary segment-dependent LLR computation process according to an alternate segment-dependent LLR embodiment of the present invention.

FIG. 10B is a flow chart describing an exemplary segment-dependent LLR computation process 1050 according to an alternate embodiment of the present invention. As shown in FIG. 10B, the exemplary segment-dependent LLR computation process 1050 initially obtains read data, r, from the flash memory 910 for the target cell during step 1060, and, optionally, one or more values, h, representing data stored in the aggressor cell(s) associated with the target cell.

The segment-dependent LLR computation process 1050 then identifies the segment, i, associated with the read value (s) for a given state during step 1070. The parameters, $k_i, b_i$, associated with the identified segment and given state are obtained during step 1080. Steps 1070 and 1080 are optionally repeated for additional states (and typically for all states). It is noted that the segments or parameters can be pattern-dependent as discussed further below in conjunction with FIG. 18. The segment may be identified associated with the read data r and the value h representing data stored in aggressor cell(s) for a given state, or the parameters may be obtained for the identified segment, the value h and the given state.

The obtained parameters for at least one state are then used during step 1090 to compute segment-dependent LLR(s) as described in the section entitled "Computation of Soft Data (LLRs)." The computed LLRs are then provided to the decoder 950 during step 1095, or optionally to an interleaver or deinterleaver. The computed LLRs may optionally be used to make a final decision on the read data, for example, based on the sign of the LLRs.

Probability Computation Process

Figure 11:
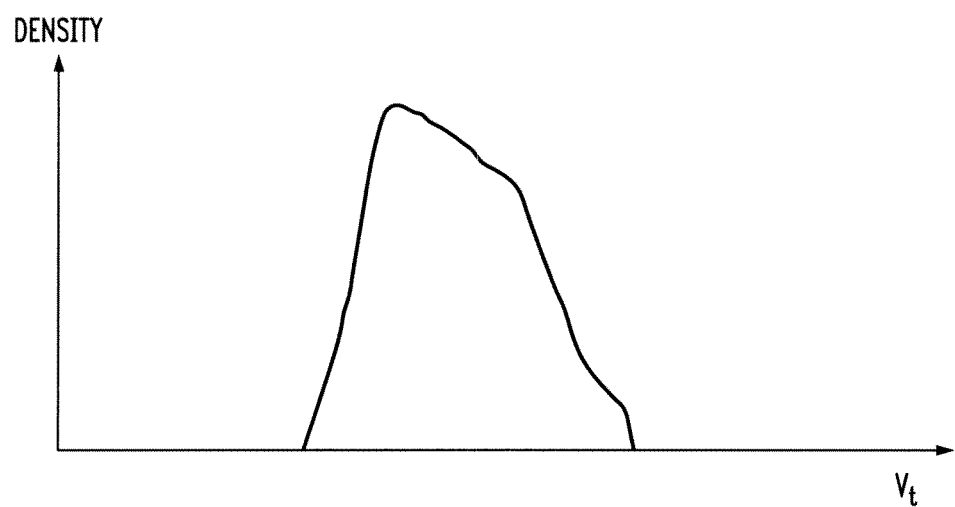
FIG. 11 illustrates an exemplary probability density function for a received or stored value of interest, for example a threshold voltage of a flash memory cell in an exemplary embodiment.

FIG. 11 illustrates an exemplary probability density function for a random variable of interest, r, where in the disclosed embodiment r represents the threshold voltage $V_t$ read from the flash memory block. The present invention computes probability values for an arbitrary PDF, such as the PDF shown in FIG. 11, using a predefined PDF, such as the Gaussian PDF. In this invention, the term "probability values" encompasses both probability densities or probabilities. As known in the art, probability densities can be expressed in terms of probabilities for discrete random variables.

In alternate embodiments, other predefined PDFs can be used. For flash memory devices, it is convenient to use Gaussian PDFs since the arbitrary PDFs associated threshold voltages can be approximated well with Gaussian PDFs as shown below. Assume that the random variable, r, has a PDF that is too complex for practical probability calculations. Now, assume that a mapping function, $\phi$, exists that maps a random variable, x with Gaussian distribution having a mean of 0 and a variance of 1 to the random variable of interest, r, as follows.

$$r=\phi(x)$$

Since the random variable x is assumed to have a Gaussian distribution with mean 0 and variance 1, its density can be described as:

$$f_x(x) = \frac{1}{\sqrt{2\pi}} e^{x^2/2}$$

While the exemplary embodiments assume that the Gaussian distribution has a mean of 0 and a variance of 1, the invention can be generalized to the case where the Gaussian distribution has a different mean and variance.

The mapping function, $\phi$, thus allows the probability of the random variable, r, to be calculated using the Gaussian distribution having a mean of 0 and a variance of 1. Other Gaussian or predefined functions can be used without a loss of generality. The probability density of a value r can be computed based on an inverse of the mapping function, $\phi$, as follows:

$$p(r) = f_r(r) = \frac{1}{|\varphi'(x = \varphi^{-1}(r))|} f_x(x = \varphi^{-1}(r)), \quad (2)$$

where $|\phi'(x)|$ is the absolute magnitude of the derivative of $\phi(x)$. It is noted that in this application, the probability density for the random variable r is denoted both by $p(r)$ and $f_r(r)$.

Assuming that x has a Gaussian distribution with mean 0 and variance 1, this probability density can be expressed as:

$$p(r) = \frac{1}{|\varphi'(\varphi^{-1}(r))| \cdot \sqrt{2\pi}} e^{-\frac{(\varphi^{-1}(r))^2}{2}} \quad (3)$$

It is noted that some communications processes and systems employ a log value of the probability density, referred to as a "log likelihood," rather than a true probability value. Thus, equation (3) can be expressed as follows:

$$\log(p(r)) = -\frac{1}{2}\log(2\pi) - \log(|\varphi'(\varphi^{-1}(r))|) - \frac{1}{2}(\varphi^{-1}(r))^2 \quad (4)$$

As previously indicated, when the mapping function, $\phi$, cannot be practically obtained, the mapping function, $\phi$, can be approximated with a piecewise linear function, L. Within each segment of the piecewise linear function, L, a Gaussian approximation is employed. As discussed hereinafter, the piecewise linear function is chosen such that the PDF of the variable obtained by applying the piece-wise linear function, L, to the random variable x with the Gaussian distribution matches the PDF of the random variable of interest, r.

First, the set of n+1 segments for the piece-wise linear function, L, is chosen in the domain of x, as follows:

$$(-\infty, a_1, a_2, \ldots a_n, \infty), \quad (5)$$

where each linear segment has an associated set of parameters $k_i, b_i$, and boundaries defined by its endpoints $(a_i, a_{i+1})$. In one exemplary implementation, the set of parameters $k_i, b_i$, are stored for each segment. Thus, for a given segment, i, the random variable, r, can be defined, for example, in slope-intercept form, as follows:

$$r = k_i x + b_i, a_i \leq x < a_{i+1} \quad (6)$$

Alternatively, the probability density of the random variable, r, can be expressed using the parameters, $k_i, b_i$, of the linear segment, as follows:

$$p(r) = \frac{1}{k_i} f_x\left(x = \frac{r - b_i}{k_i}\right) = \frac{1}{k_i \sqrt{2\pi}} e^{-\left(\frac{r-b_i}{k_i}\right)^2 / 2}. \quad (7)$$

The corresponding log likelihoods can be computed as:

$$\log p(r) = -\frac{1}{2}\log(2\pi) - \log(k_i) - \frac{1}{2}\left(\frac{r-b_i}{k_i}\right)^2 \quad (8)$$

Figure 12:
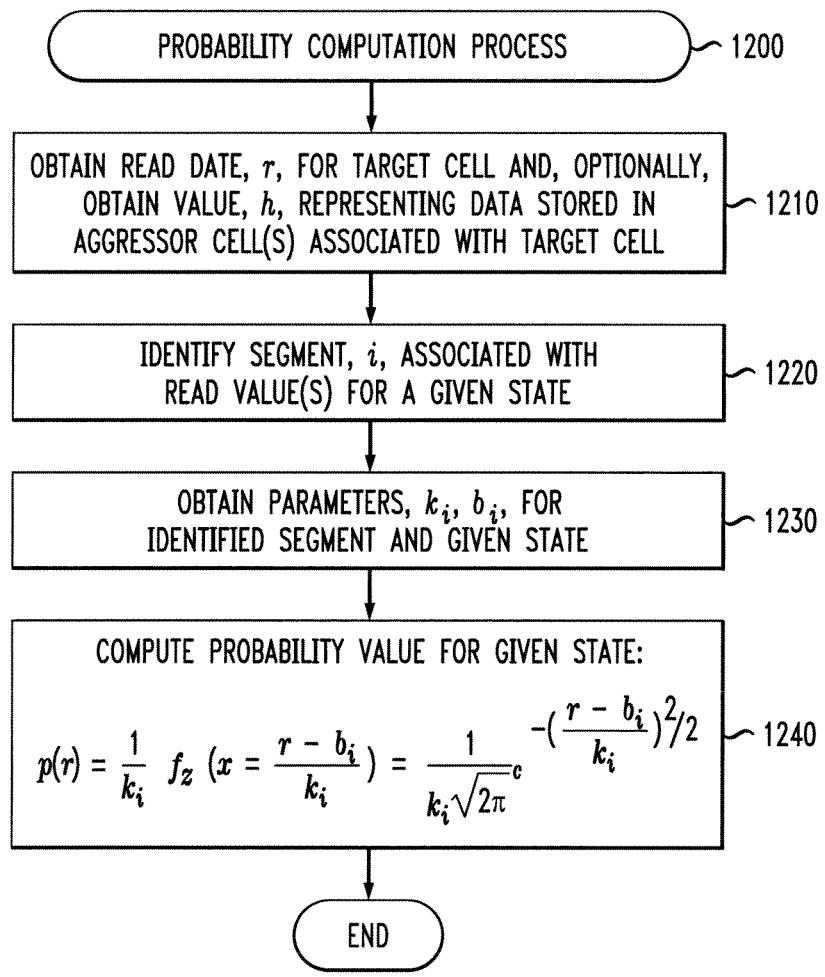
FIG. 12 is a flow chart describing an exemplary implementation of a probability computation process incorporating features of the present invention.

FIG. 12 is a flow chart describing an exemplary implementation of a probability computation process 1200 incorporating features of the present invention. The exemplary probability computation process 1200 is separately executed for each state and is typically performed for all states. As discussed above in conjunction with FIG. 2, in the exemplary embodiment, each storage element employs four possible data states to store two bits of data in each memory cell (each of the four peaks 210-213 in FIG. 2 corresponds to one state). The probability values computed by the probability computation process 1200 are used, for example, by the soft demapper to compute LLRs.

As shown in FIG. 12, the probability computation process 1200 initially obtains read data, r, from the flash memory 910 for the target cell during step 1210, and, optionally, one or more values, h, representing data stored in the aggressor cell(s) associated with the target cell.

Thereafter, the probability computation process 1200 identifies the segment, i, of the piece-wise linear function, L, associated with the read value(s) during step 1220 for a given state. The segment i is chosen such that the received value r satisfies following condition:

$$k_i a_i + b_i \leq r < k_i a_{i+1} + b_i \quad (9)$$

The parameters, $k_i, b_i$, associated with the identified segment and given state are obtained during step 1230. As discussed further below in conjunction with FIG. 18, the parameters, $k_i, b_i$, associated with the identified segment can optionally be pattern-dependent. The segment may be identified for the read data r and the value h representing data stored in aggressor cell(s), or the parameters may be obtained for the identified segment, the value h and the given state.

Finally, the probability value for the read data r is calculated during step 1240 for the given state (for example using equation (7) in the exemplary embodiment).

Corresponding log-likelihoods can be computed using equation (8).

Computation of Soft Data (LLRs)

The computation of log-likelihood ratios in step 1030 using probability values computed based on read values is described in further detail in International Patent Application Serial No. PCT/US09/49333, entitled "Methods and Apparatus for Soft Demapping and Intercell Interference Mitigation in Flash Memories", filed Jun. 30, 2009, and in International Patent Application Serial No. PCT/US09/59077, entitled "Methods and Apparatus for Soft Data Generation for Memory Devices," filed Sep. 30, 2009, incorporated by reference herein. In one embodiment, for any number of bits per cell, the extrinsic LLR for bit $C_i$ is computed by the Soft Demapper/Soft Data Generator 1000 as $$L_e(C_i) = \log \frac{\sum_{s \in \chi_0^i} p(r|s) \cdot \prod_{j=1, j \neq i}^{m} \exp(-L_a(C_j) \cdot c_j)}{\sum_{s \in \chi_1^i} p(r|s) \cdot \prod_{j=1, j \neq i}^{m} \exp(-L_a(C_j) \cdot c_j)}, \quad (10)$$

where:
r: received signal
s: original stored state or level given by stored bits ($c_0, c_1, \ldots c_m$)
$c_i$: coded bit
m bits per cell $$L_a(C_i) = \log \frac{P(C_i = 0)}{P(C_i = 1)}: \text{ a-priori LLR}$$

$L_e(C_i)$: extrinsic LLR
$X_{c_i}^i$: subset of states or levels whose bit labels have the value $C_i = c_i$ in position i
and where $L_a(C_i)$ is for example provided by the decoder 950, such as an LDPC decoder. In the first iteration, $L_a(C_i)$ can be initialized to 0. The probability values (probability densities or probabilities) p(r|s) are computed for state s as described above using equations 2, 3 or 7, where the computed probability value p(r) for a state s is inserted as p(r|s) in equation 10. International Patent Application Serial No. PCT/US09/49333, entitled "Methods and Apparatus for Soft Demapping and Intercell Interference Mitigation in Flash Memories", filed Jun. 30, 2009, and International Patent Application Serial No. PCT/US09/59077, entitled "Methods and Apparatus for Soft Data Generation for Memory Devices," filed Sep. 30, 2009, describe also alternative LLR computation techniques that can be used here as well.

Pattern-dependent LLRs for one or more soft values, r, for the target cell and one or more values, $\bar{h}$, for the aggressor cell(s), received from the flash memory 900 can be computed as:

$$L_e(C_i) = \log \frac{\sum_{s \in \chi_0^i} p(r \mid s, \bar{h}) \cdot \prod_{j=1, j \neq i}^{m} \exp(-L_a(C_j) \cdot c_j)}{\sum_{s \in \chi_1^i} p(r \mid s, \bar{h}) \cdot \prod_{j=1, j \neq i}^{m} \exp(-L_a(C_j) \cdot c_j)}, \quad (11)$$

where $\bar{h}$ is the data pattern stored in the surrounding cell(s) or in other cells that cause disturbance on the target cell. For example:

$\bar{h} = (h^{k \pm 1, l}, h^{k, l \pm 1}, h^{h \pm 1, l \pm 1})$ denotes all aggressor cells that are adjacent to the target cell at location (k,l) for which the LLR is being computed.

The pattern $\bar{h}$ can be obtained for example by reading out hard or soft data from the aggressor cells.

The probability values $p(r \mid s, \bar{h})$ (probability densities or probabilities) are computed for states s as described above using equations 2, 3 or 7, where the parameters k and b are chosen as a function of the pattern $\bar{h}$.

In the alternative embodiment of FIG. 10B, segment-dependent LLRs can be computed in step 1090 directly based on the parameters k, b without first explicitly computing the probability values p(r), for example using following equation:

$$L_e(C_i) = \log \frac{\sum_{s \in \chi_0^i} \frac{1}{\sigma(s)} \exp\left(-\frac{1}{2\sigma(s)^2}(r - E\{r \mid s\})^2\right) \cdot \prod_{j=1, j \neq i}^{m} \exp(-L_a(C_j) \cdot c_j)}{\sum_{s \in \chi_1^i} \frac{1}{\sigma(s)} \exp\left(-\frac{1}{2\sigma(s)^2}(r - E\{r \mid s\})^2\right) \cdot \prod_{j=1, j \neq i}^{m} \exp(-L_a(C_j) \cdot c_j)} \quad (12)$$

$$= \log \frac{\sum_{s \in \chi_0^i} \frac{1}{\sigma(s)} \exp\left(-\frac{1}{2\sigma(s)^2}(r - E\{r \mid s\})^2 - \sum_{j=1, j \neq i}^{m} L_a(C_j) \cdot c_j\right)}{\sum_{s \in \chi_1^i} \frac{1}{\sigma(s)} \exp\left(-\frac{1}{2\sigma(s)^2}(r - E\{r \mid s\})^2 - \sum_{j=1, j \neq i}^{m} L_a(C_j) \cdot c_j\right)}$$

where $\sigma(s) = k_i(s)$, and $E\{r \mid s\} = b_i(s)$. The values $k_i(s)$ and $b_i(s)$ are the parameters k and b that were obtained for state s for the segment i that was identified based on the read value r. In an alternative embodiment, pattern-dependent, segment-dependent LLRs can be computed as follows:

$$L_e(C_i) = \log \frac{\sum_{s \in \chi_0^i} \frac{1}{\sigma(s, \bar{h})} \exp\left(-\frac{1}{2\sigma(s, \bar{h})^2}(r - E\{r \mid s, \bar{h}\})^2 - \sum_{j=1, j \neq i}^{m} L_a(C_j) \cdot c_j\right)}{\sum_{s \in \chi_1^i} \frac{1}{\sigma(s, \bar{h})} \exp\left(-\frac{1}{2\sigma(s, \bar{h})^2}(r - E\{r \mid s, \bar{h}\})^2 - \sum_{j=1, j \neq i}^{m} L_a(C_j) \cdot c_j\right)} \quad (13)$$

where $\sigma(s, \bar{h}) = k_i(s, \bar{h})$, and $E\{r \mid s, \bar{h}\} = b_i(s, \bar{h})$. The values $k_i(s, \bar{h})$ and $b_i(s, \bar{h})$ are the parameters k and b that were obtained for states and pattern $\bar{h}$, for the segment i hot was identified based on the read value r and optionally pattern $\bar{h}$.

PDF Estimation Process

Figure 13:
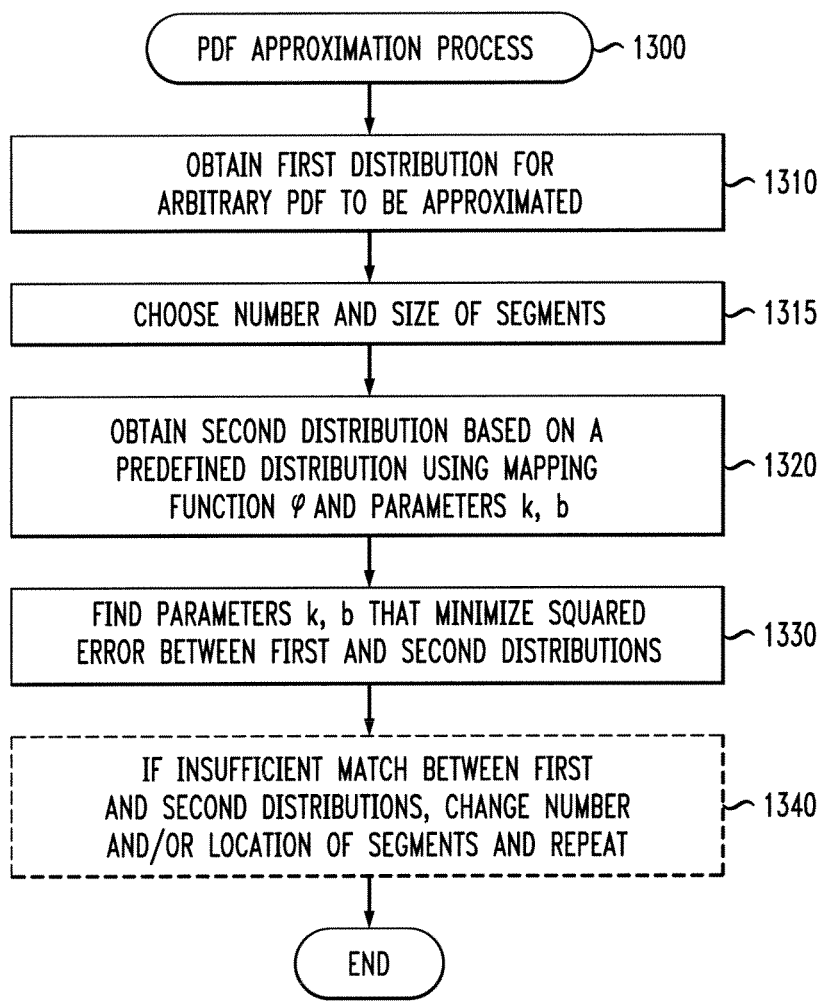
FIG. 13 is a flow chart describing an exemplary PDF approximation process for determining the parameters of a piecewise linear function.

FIG. 13 is a flow chart describing an exemplary PDF approximation process 1300 for determining the parameters $(a_i, k_i, b_i)$ of the piece wise linear function $\phi$. Generally, the exemplary PDF approximation process 1300 finds the set of parameters that minimizes the squared error between the targeted distribution and one obtained by mapping a Gaussian distribution through the mapping function $\phi$. It is usually sufficient to choose the set of points $(a_1, a_2, \ldots a_n)$ that determine the boundary of linear segments as equidistant. Generally, the larger the number of segments, the better the approximation provided by the function $\phi$. It is assumed that the set of points $(a_1, a_2, \ldots a_n)$ is given, such that the function $\phi$ is linear on each segment $(a_i, a_{i+1})$, and that the parameters of each linear segment $(k_i, b_i)$ are obtained to minimize the squared error between the targeted distribution and its approximation by mapping a Gaussian distribution through the piecewise linear function.

If the targeted distribution $p(r) = f_r(r)$ is expressed in closed parametric form, then the optimization problem can be solved in a closed form and one can obtain the set of values $(k_i, b_i)$ that minimize the squared error. The coefficients are obtained by minimizing the following function with respect to $(k_i, b_i)$ where $f_r^G(r; b_i, k_i^2$ is the probability density function of a random variable with Gaussian distribution, mean $b_i$ and variance $k_i^2$.

$$\varepsilon = \int_{-\infty}^{a_1} (f_r(r) - f_r^G(r; b_i, k_i^2))^2 \, dr + \quad (14)$$

$$\sum_{i=1}^{n} \int_{a_1}^{a_n} (f_r(r) - f_r^G(r; b_i, k_i^2))^2 \, dr + \int_{a_n}^{\infty} (f_r(r) - f_r^G(r; b_i, k_i^2))^2 \, dr$$

Generally, the above equation (14) computes the squared errors for every segment and sums the squared errors for all segments. The first term performs an integration from minus infinity to the first segment point, $a_1$, the second term performs a sum of the integrals for all segments between the first segment point, $a_1$, to the final segment point, $a_n$; and the final term performs an integration from the final segment point, $a_n$, to positive infinity.

Thus, as shown in FIG. 13, the exemplary PDF approximation process 1300 initially obtains a first distribution for the arbitrary PDF to be approximated during step 1310. Thereafter, a number and size of segments can be selected during step 1315. It is noted that segments having a non-uniform size can optionally be employed to achieve better accuracy in certain portions of the distribution.

The exemplary PDF approximation process 1300 then obtains a second distribution based on a predefined distribution, such as a Gaussian distribution during step 1320. The second distribution can be obtained for example by transforming a Gaussian distribution with mean 0 and variance 1 using the mapping function $\phi$ and parameters k, b. The mapping function $\phi$ can be for example a piecewise-linear function, where each segment i has corresponding parameters $k_i$ and $b_i$. In an alternate embodiment, another predefined distribution can be used instead of the Gaussian distribution, and other parameters instead of k and b can be used.

The parameters k, b that minimize the squared error between the first and second distributions are identified during step 1330. The parameters can be identified for each segment or globally. In a segment-based identification of the parameters, the parameters are selected for each segment that minimize the squared error between the first and second distributions for the corresponding segment. The process is then repeated for all segments. In a global-based identification of the parameters, the total squared error for all segments is computed as a sum as described in equation 14, and then the parameters k and b are selected for all segments jointly such that the total squared error is minimized. In an alternate embodiment where other parameters are used instead of k and b, these other parameters are optimized such that the squared error between the first and second distributions is minimized as described here.

As discussed further below in conjunction with FIG. 18, the parameters a, k, b can be chosen and estimated for each state as a function of the pattern $\bar{h}$ stored in or read from the aggressor cells.

The number and/or locations of the segments can optionally be changed during step 1340 if there is an insufficient match (based on a predefined standard) between the first and second distributions. The process can then be repeated with the modified segment number and/or location. For example, the number of segments can be increased if there is an insufficient match.

In many practical situations, however, the targeted distribution $f_r(r)$ cannot be expressed in closed parametric form but, rather, the targeted distribution $f_r(r)$ is obtained through measurements. The parameters k, b can be obtained based on the measurements in advance during a parameter characterization phase, for example during product development, product prototyping or manufacturing tests, or adaptively on an intermittent or periodic basis. In all cases, the set of values $(k_i, b_i)$ in step 1330 that minimizes the squared error can be obtained iteratively through computer simulations.

In an adaptive parameter characterization implementation, the parameters k, b can be obtained based on measured or estimated distributions of the received data. The estimated distributions can be based, for example, on a measurement of parameters for the distribution, such as a mean and variance of the distribution, or on a passage of time or a usage counter (for example for program, erase or read cycles). The adaptively updated parameters k, b are then used to update the look-up tables 1800 or used to evaluate the expressions that account for performance factors (as discussed further below in conjunction with FIG. 18). It is noted that an adaptive parameter characterization implementation inherently accounts for performance factors, as the parameters are re-computed for the current operating condition, which addresses how the performance factors have influenced the memory or communication system over time. In this manner, an adaptive parameter characterization implementation may eliminate or simplify the table(s) 1800. While the parameters are still needed for each segment, they are no longer needed for each considered performance factor.

For a more detailed discussion of performance factors and their influence on memories and/or communication systems over time, see, for example, International Patent Application Serial No. PCT/US09/59069, entitled "Methods and Apparatus for Soft Data Generation for Memory Devices Based on Hard Data and Performance Factor Adjustment," filed Sep. 30, 2009 and incorporated by reference herein.

Figure 14:
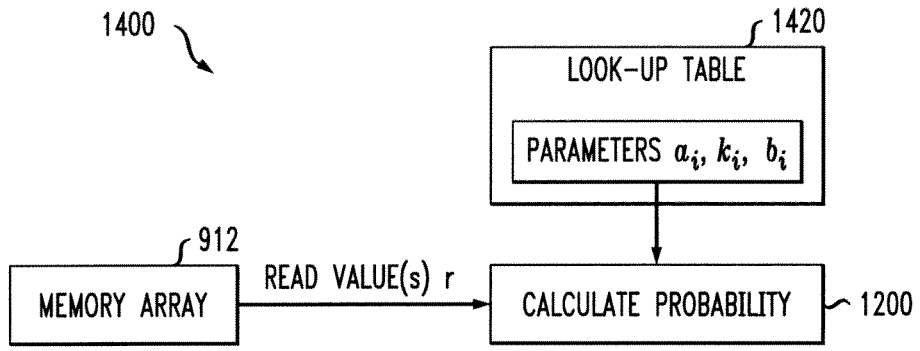
FIG. 14 is a block diagram of an exemplary system that employs the parameters of a piece-wise linear function to compute probability values.

FIG. 14 is a block diagram of an exemplary system 1400 that employs the probability values computed herein. As shown in FIG. 14, a read value is received, for example, by a read channel controller, from the memory array 912. Based on the read value, the corresponding segment, i, of the linear function, L, is identified, and used to retrieve the corresponding parameters, $k_i, b_i$, associated with the identified segment from a look up table 1420. It is noted that the parameters, $k_i, b_i$, can be stored in the look up table 1420 in a multi-dimensional table, for example, as a function of various operating conditions, such as process, temperature, a number of program, erase, read cycles or other aging factors. It is generally recognized that the voltage distortions change as a function of operating conditions. Exemplary look up tables 1420 are discussed further below in conjunction with FIG. 18.

Finally, a computation block 1200 computes the probability value for the received value, r, using equation (2), (3) or (7) and the process described above in conjunction with FIG. 12. Corresponding log-likelihoods can be computed using equation (8).

Figure 15:
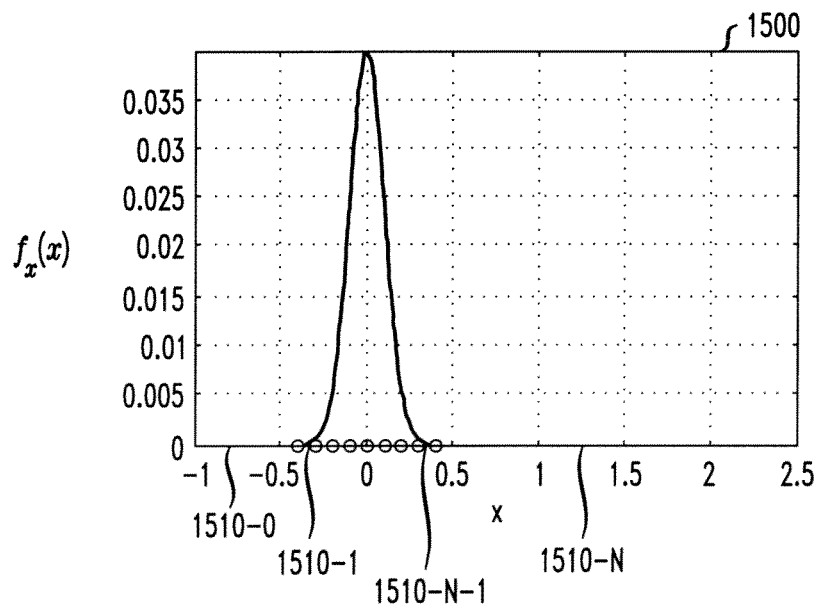
FIGS. 15 through 17 illustrate the approximation of a probability density function for an arbitrary random variable, r, using a Gaussian approximation in accordance with the present invention.
Figure 16:
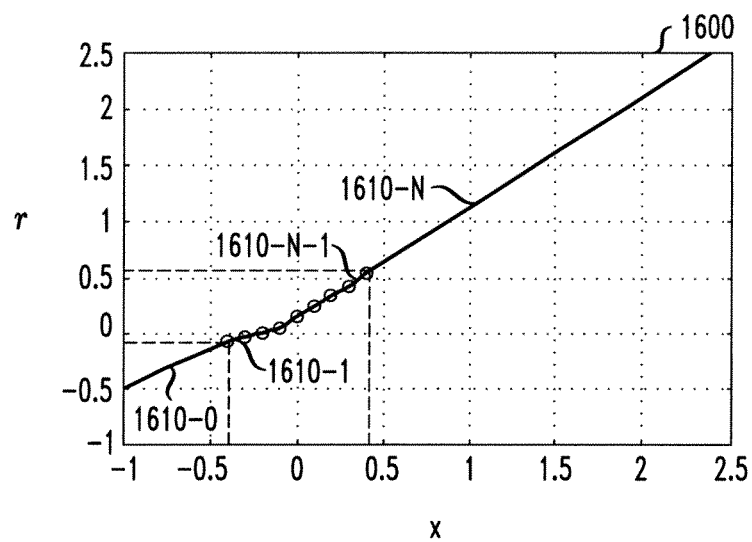
Figure 17:
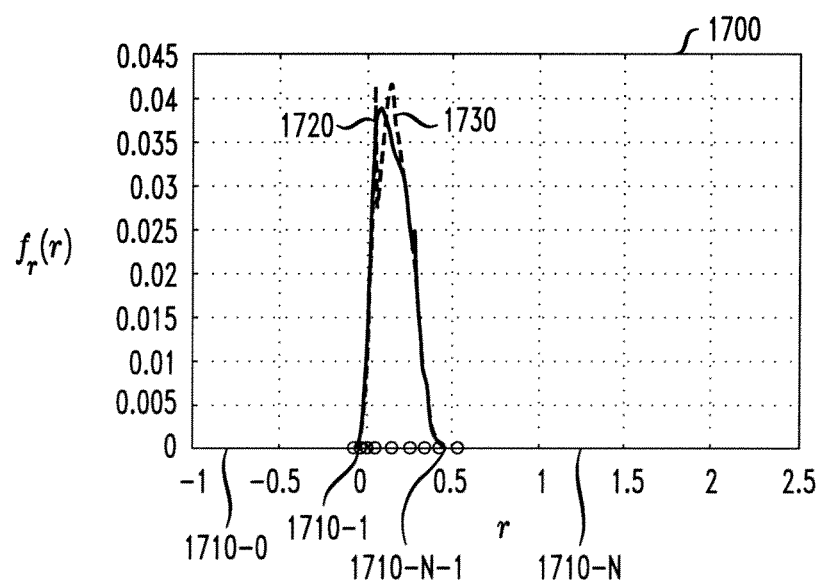

FIGS. 15 through 17 illustrate the approximation of a probability density function for an arbitrary received or stored value, r, using a Gaussian approximation. FIG. 15 illustrates an exemplary probability density function 1500 having a Gaussian distribution, with an exemplary mean of 0 and a variance of 1. As shown along the x axis, there are a number of segments 1510-0 through 1510-N. As discussed below, the range for the random variable r can be split into segments, and probabilities for the random variable r can be computed based on the corresponding Gaussian segments 1510. As already indicated above, other predefined distributions can be used instead of a Gaussian distribution to approximate the arbitrary distribution of the random variable r in a similar manner as described below.

FIG. 16 illustrates a piecewise linear function, L, 1600 comprised of a plurality, N+1, of Gaussian segments 1610-0 through 1610-N. As indicated above, each linear segment 1610-i has an associated set of parameters $k_i, b_i$, and boundaries defined by the endpoints $a_i, a_{i+1}$, of the segment. The piecewise linear function, L, shown in FIG. 16 approximates the mapping function, $\phi$. The x-axis in FIG. 16 is in the domain of the original random variable x and the y-axis is in the domain of the transformed random variable r. Generally, the probability corresponding to small intervals of x and r is maintained and x is transformed to r, using the function $\phi$ of FIG. 16.

The parameters $k_i, b_i$, for each linear segment 1610-i are obtained by the PDF approximation process 1300.

FIG. 17 illustrates the probability density function 1720 for an arbitrary random variable, r. Generally, as indicated above, the piecewise linear function, L, of FIG. 16 maps the Gaussian distribution of FIG. 15 to the probability density function 1720 for the random variable, r. As shown in FIG. 17, the exemplary values, r, along the x axis, for segments 1710-1 to 1710-N−1 vary from a value just below 0, to a value just above 0.5 (consistent with the r=$\phi$(x) values demarcated by the dashed lines in FIG. 16). The segments 1710-0 through 1710-N correspond to the segments of FIGS. 15 and 16.

FIG. 17 includes a first trace 1720 corresponding to a distribution for the arbitrary PDF to be approximated. In addition, a second trace 1730 corresponds to the distribution obtained by transforming the random variable x with the Gaussian distribution using the piecewise linear function φ. The two traces 1720, 1730 are preferably as close as possible to one another, which can be achieved by minimizing the squared error using the PDF estimation process 1300 described above.

FIG. 18 is a sample table for an exemplary probability parameter look-up table 1800 that records the parameters for a given state, such as state 0, for each segment of the piecewise linear mapping function. As discussed above in conjunction with FIG. 2, in the exemplary embodiment, each storage element employs four possible data states to store two bits of data in each memory cell (each of the four peaks 210-213 in FIG. 2 corresponds to one state).

In the exemplary embodiment of FIG. 18, the parameters are recorded for various performance factors that affect the performance of the flash memory block 810. For example, the performance factors may comprise one or more of endurance (e.g., number of program and/or erase cycles), number of read and/or program cycles, retention time, temperature or temperature changes of the flash memory, process corner used to manufacture the flash memory, inter-cell interference impact or impact due to other disturbance mechanisms, location within the memory array (such as the page level in a wordline, even or odd bitlines, location within a memory block, etc.) and data patterns stored in aggressor cells.

As shown in FIG. 18, in one exemplary embodiment, a set of parameters for a given state, such as state 0, can be assigned for each segment based on the performance factors, such as number of program/erase (P/E) cycles. The performance factors can be measured in advance, for example, during product development, product prototyping, manufacturing tests, or on an intermittent or periodic basis, to obtain parameters that reflect the performance degradation due to performance factors. These performance factors and corresponding parameters can be programmed or stored in a look-up table 1420 or in registers of the flash control system 810 or flash memory 860.

The parameters are stored in the exemplary look-up table 1800 in FIG. 18 for an exemplary two-bit/cell MLC flash memory. The exemplary probability parameter look-up table 1800 records the parameters in records 1830 and 1840, respectively, based on the state indicated in record 1810, and the number of program/erase cycles indicated in record 1820.

The probability parameter look-up table 1800 could also indicate additional location-specific performance factors and corresponding parameters, such as separate parameters for even/odd bit lines and/or different wordline locations within a memory array. The exemplary table 1800 is shown for a single state (0) and performance factor (P/E Cycles). It is noted that the exemplary table 1800 can optionally be implemented as a multi-dimensional table to account for pattern-dependency (e.g., the aggressor values in the vicinity of a given target cell) and/or additional performance factors, such as number of read cycles, process corner and temperature changes. Generally, the probability parameter look-up table 1800 can be extended to include an entry containing the parameters (k and b) for each combination of (1) considered performance factors; (2) state (e.g., 11, 10, 00, 01); and (3) pattern (e.g., the aggressor values in the vicinity of a given target cell). The number and/or location of the segments can be unique for each state and/or each pattern.

Rather than storing the parameters in one or more table(s) 1800, it is noted that the parameters can alternatively be computed in real-time based on an expression that accounts for performance factors such as a number of program/erase cycles, retention time, temperature, temperature changes, etc., as would be apparent to a person of ordinary skill in the art.

Whether the parameters are stored in one or more table(s) 1800, or computed in real-time based on an expression, the parameters can optionally be updated over time, as discussed above in conjunction with FIG. 13, using adaptive measurements and/or estimates of the distribution of received values and/or performance factors. For a more detailed discussion of performance factors and their influence on memories and/or communication systems over time, see, for example. International Patent Application Serial No. PCT/US09/59069, entitled "Methods and Apparatus for Soft Data Generation for Memory Devices Based on Hard Data and Performance Factor Adjustment," filed Sep. 30, 2009 and incorporated by reference herein.

For a more detailed discussion of pattern-dependent and location-specific performance factors, see, for example, International Patent Application Serial No. PCT/US09/59077, entitled "Methods and Apparatus for Soft Data Generation in Flash Memories," filed on Sep. 30, 2009, incorporated by reference herein.

Figure 19:
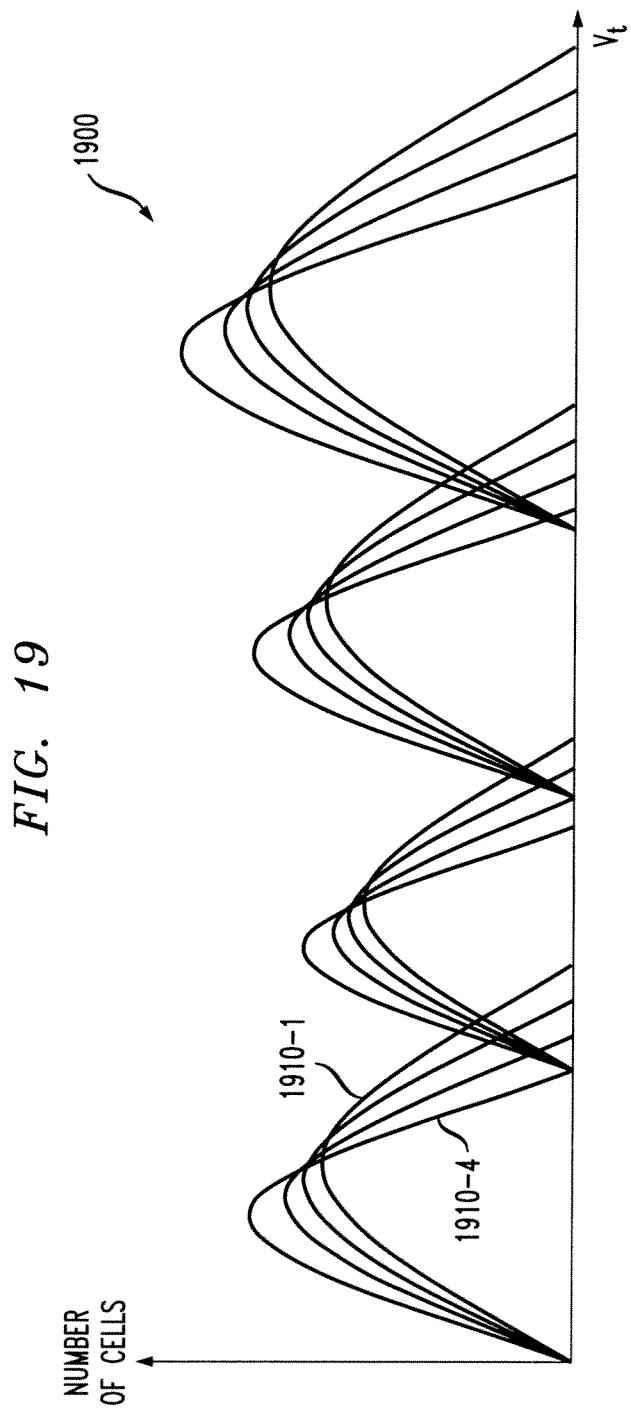
FIG. 19 illustrates an exemplary collection of probability density functions for a given target cell of an exemplary multi-level cell flash memory, based on all the possible values of each aggressor cell.

FIG. 19 illustrates an exemplary collection 1900 of probability density functions 1910 for a given target cell 710 of an exemplary multi-level cell flash memory 600, based on all the possible values of each aggressor cell 720. The exemplary multi-level cell flash memory has four levels or states per cell (two bits), and one aggressor cell 720 is considered for the data-dependent PDFs. The number of probability density functions applicable to each possible level or state of a given target cell 710 is the number of possible levels or states for each aggressor cell 720 raised to the number of aggressor cells 720 that affect a given target cell 710. In the exemplary embodiment, each cell can have one of four possible values, there is one aggressor cell 720 per target cell 710 and each aggressor cell 720 can have one of four possible levels or states. Thus, for illustration, the collection 1900 of probability density functions comprises four probability density functions 1910-1 through 1910-4 for voltage level or state 0, attributable to a pattern of the aggressor cells. There are also four probability density functions for each of the other states 1, 2 and 3. The present invention can be extended to multi-level cell flash memories 600 having an arbitrary number of levels or states per cell, and an arbitrary number of aggressor cells 720, as would be apparent to a person of ordinary skill in the art.

A look-up table, such as the look-up table 1800 of FIG. 18, can record the parameters of a given probability density function 1910 for each state, and, optionally, for each pattern for a given state. As received values are obtained for a given target and corresponding aggressor cell(s), the appropriate segment can be identified and the corresponding parameters can be obtained from the appropriate look-up table.

Generally, each probability density function in FIG. 19 expresses, among other noise and disturbance effects, the ICI effect on a given target cell 710 for a given value of a corresponding aggressor cell 720. In a further embodiment of the invention, the data-dependent probability density functions can express other data-dependent distortion instead of ICI or in addition to ICI. As discussed hereinafter, in various embodiments, the probability density functions can be pre-defined and static, adapted based on real-time observations, or expressed as a function of the measured or detected value, h, for the aggressor cell 720, such as a Gaussian function. The parameters a, k and b in the loop-up table could then also be predefined and static, adapted based on real-time observations, or expressed as a function of the measured or detected value, h, for the aggressor cell 720.

In a further variation, the computation of the probability values for random variables having an arbitrary distribution can be performed using one or more look-up tables (LUTs), where the probability values are pre-computed for a limited number of sample points. This approach, however, may introduce quantization and quantization errors as only a finite number of values are chosen to represent the PDF. On the other hand, the computational complexity and storage requirements may be significantly reduced.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for approximating a target distribution for a received value in one or more of a communication system and a memory device, comprising:

reducing using at least one hardware device a squared error between said target distribution of said received values and a second distribution obtained by mapping a predefined distribution through a mapping function, wherein said second distribution has an associated set of parameters.

2. The method of claim 1, wherein said second distribution is used to compute one or more probability values for said received values in said one or more of said communication system and said memory device.

3. The method of claim 2, wherein said probability values are one or more of probability densities and probabilities.

4. The method of claim 1, wherein said second distribution is used to compute one or more of soft data values and log likelihood ratios for said received values in said one or more of said communication system and said memory device.

5. The method of claim 1, wherein said target and second distributions are probability density functions.

6. The method of claim 1, wherein said mapping function is a piecewise linear function.

7. The method of claim 1, wherein said second distribution has a plurality of segments and wherein each of said segments has an associated set of parameters, and wherein said associated set of parameters are used to compute one or more of probability values, soft data values and log likelihood ratios for said received values in said one or more of said communication system and said memory device.

8. The method of claim 1, wherein said second distribution has a plurality of segments and wherein each of said segments has an associated set of parameters, and wherein said associated set of parameters are one or more of stored in at least one table and expressed using an expression.

9. The method of claim 1, wherein said predefined distribution is a Gaussian distribution.

10. The method of claim 1, wherein said predefined distribution can be characterized using a mathematical expression.

11. The method of claim 1, wherein said second distribution has a plurality of segments and wherein each of said segments has an associated set of parameters, wherein said squared error is computed individually for each of said segments and wherein said parameters are selected for a given segment to substantially minimize a squared error for said given segment.

12. The method of claim 1, wherein said second distribution has a plurality of segments and wherein each of said segments has an associated set of parameters, wherein a combined squared error is collectively computed for substantially all of said segments and wherein said parameters are selected for each segment by substantially minimizing said combined squared error.

13. The method of claim 1, wherein said second distribution has a plurality of segments and wherein each of said segments has an associated set of parameters and wherein said set of parameters are obtained by substantially minimizing the following expression with respect to parameters ($k_i$, $b_i$):

$$\varepsilon = \int_{-\infty}^{a_1} (f_r(r) - f_r^G(r; b_i, k_i^2))^2 \, dr + \sum_{i=1}^{n} \int_{a_1}^{a_n} (f_r(r) - f_r^G(r; b_i, k_i^2))^2 \, dr + \int_{a_n}^{\infty} (f_r(r) - f_r^G(r; b_i, k_i^2))^2 \, dr$$

where $f_r^G(r; b_i, k_i^2)$ is a probability density function of a Gaussian distribution with mean $b_i$ and variance $k_i^2$.

14. The method of claim 1, wherein said target distribution is expressed in closed parametric form.

15. The method of claim 1, wherein said target distribution is obtained through measurements.

16. The method of claim 15, wherein said second distribution has a plurality of segments and wherein each of said segments has an associated set of parameters, wherein said measurements are obtained for at least one target distribution as a function of at least one performance factor and wherein said squared error is substantially minimized for said at least one performance factor to obtain said parameters for said performance factor.

17. The method of claim 1, wherein said second distribution has a plurality of segments and wherein each of said segments has an associated set of parameters, wherein said set of parameters are obtained iteratively through computer simulations.

18. The method of claim 1, wherein said second distribution has a plurality of segments and wherein each of said segments has an associated set of parameters, wherein said set of parameters are obtained during one or more of an initial parameter characterization phase and on an intermittent basis.

19. The method of claim 18, wherein said initial parameter characterization phase occurs during one or more of product development, product prototyping and manufacturing testing.

20. The method of claim 1, wherein said second distribution has a plurality of segments and wherein each of said segments has an associated set of parameters, wherein said set of parameters are adaptively updated using measured or estimated distributions for said received value.

21. The method of claim 20, wherein said estimated distributions are based on one or more of a measurement of parameters for said distribution, a passage of time and a usage counter.

22. The method of claim 20, wherein said adaptively updated parameters are used for one or more of updating one or more tables and evaluating an expression that accounts for one or more performance factors.

23. An apparatus for approximating a target distribution for a received value in one or more of a communication system and a memory device, comprising:
a memory; and
at least one processor, coupled to the memory, operative to:
reduce a squared error between said target distribution of said received values and a second distribution obtained by mapping a predefined distribution through a mapping function, wherein said second distribution has an associated set of parameters.

24. The apparatus of claim 23, wherein said apparatus comprises part of a flash memory control system.

25. The apparatus of claim 23, wherein said second distribution is used to compute one or more of probability values for said received values in said one or more of said communication system and said memory device, soft data values and log likelihood ratios for said received values in said one or more of said communication system and said memory device.

26. The apparatus of claim 23, wherein said target and second distributions are probability density functions.

27. The apparatus of claim 23, wherein said mapping function is a piecewise linear function.

28. The apparatus of claim 23, wherein said second distribution has a plurality of segments and wherein each of said segments has an associated set of parameters, and wherein said associated set of parameters are used to compute one or more of probability values, soft data values and log likelihood ratios for said received values in said one or more of said communication system and said memory device.

29. The apparatus of claim 23, wherein said second distribution has a plurality of segments and wherein each of said segments has an associated set of parameters, and wherein said associated set of parameters are one or more of stored in at least one table and expressed using an expression.

30. The apparatus of claim 23, wherein said predefined distribution is a Gaussian distribution.

31. The apparatus of claim 23, wherein said second distribution has a plurality of segments and wherein each of said segments has an associated set of parameters, wherein said squared error is computed individually for each of said segments and wherein said parameters are selected for a given segment to substantially minimize a squared error for said given segment.

32. The apparatus of claim 23, wherein said second distribution has a plurality of segments and wherein each of said segments has an associated set of parameters, wherein a combined squared error is collectively computed for substantially all of said segments and wherein said parameters are selected for each segment by substantially minimizing said combined squared error.

33. The apparatus of claim 23, wherein said second distribution has a plurality of segments and wherein each of said segments has an associated set of parameters, wherein said set of parameters are adaptively updated using measured or estimated distributions for said received value.

34. The apparatus of claim 23, wherein said adaptively updated parameters are used for one or more of updating one or more tables and evaluating an expression that accounts for one or more performance factors.

* * * * *